(12) United States Patent
Currie et al.

(10) Patent No.: US 7,884,353 B2
(45) Date of Patent: *Feb. 8, 2011

(54) SEMICONDUCTOR STRUCTURES EMPLOYING STRAINED MATERIAL LAYERS WITH DEFINED IMPURITY GRADIENTS AND METHODS FOR FABRICATING SAME

(75) Inventors: Matthew Currie, Windham, NH (US); Anthony Lochtefeld, Somerville, MA (US); Richard Hammond, Cardiff (GB); Eugene Fitzgerald, Windham, NH (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 674 days.

This patent is subject to a terminal disclaimer.

(21) Appl. No.: 10/972,578

(22) Filed: Oct. 25, 2004

(65) Prior Publication Data
US 2005/0054168 A1 Mar. 10, 2005

Related U.S. Application Data

(63) Continuation of application No. 10/251,424, filed on Sep. 20, 2002, now Pat. No. 6,831,292.

(51) Int. Cl.
*H01L 29/06* (2006.01)
(52) U.S. Cl. .................. 257/19; 257/E29.193
(58) Field of Classification Search ........ 257/192–196, 257/18, 19, E29.193
See application file for complete search history.

(56) References Cited

U.S. PATENT DOCUMENTS

| 4,010,045 | A | 3/1977 | Ruehrwein |
| 4,710,788 | A | 12/1987 | Dambkes et al. |
| 4,849,370 | A | 7/1989 | Spratt |
| 4,987,462 | A | 1/1991 | Kim et al. |
| 4,990,979 | A | 2/1991 | Otto et al. |
| 4,997,776 | A | 3/1991 | Harame et al. |
| 5,013,681 | A | 5/1991 | Godbey et al. |
| 5,089,872 | A | 2/1992 | Ozturk et al. |
| 5,155,571 | A | 10/1992 | Wang et al. |
| 5,166,084 | A | 11/1992 | Pfiester |
| 5,177,583 | A | 1/1993 | Endo et al. |

(Continued)

FOREIGN PATENT DOCUMENTS

DE 41 01 167 7/1992

(Continued)

OTHER PUBLICATIONS

Abstreiter et al., "Silicon/Germanium Strained Layer Superlattices," 95 J. Crystal Growth 431 (1989).

(Continued)

*Primary Examiner*—Richard A. Booth
(74) *Attorney, Agent, or Firm*—Slater & Matsil, L.L.P.

(57) ABSTRACT

Semiconductor structures and devices including strained material layers having impurity-free zones, and methods for fabricating same. Certain regions of the strained material layers are kept free of impurities that can interdiffuse from adjacent portions of the semiconductor. When impurities are present in certain regions of the strained material layers, there is degradation in device performance. By employing semiconductor structures and devices (e.g., field effect transistors or "FETs") that have the features described, or are fabricated in accordance with the steps described, device operation is enhanced.

49 Claims, 4 Drawing Sheets

U.S. PATENT DOCUMENTS

| | | | |
|---|---|---|---|
| 5,202,284 A | 4/1993 | Kamins et al. | |
| 5,207,864 A | 5/1993 | Bhat et al. | |
| 5,208,182 A | 5/1993 | Narayan et al. | |
| 5,212,110 A | 5/1993 | Pfiester et al. | |
| 5,221,413 A | 6/1993 | Brasen et al. | |
| 5,241,197 A | 8/1993 | Murakami et al. | |
| 5,242,847 A | 9/1993 | Ozturk et al. | |
| 5,250,445 A | 10/1993 | Bean et al. | |
| 5,283,456 A | 2/1994 | Hsieh et al. | 257/347 |
| 5,285,086 A | 2/1994 | Fitzgerald, Jr. | |
| 5,291,439 A | 3/1994 | Kauffmann et al. | |
| 5,298,452 A | 3/1994 | Meyerson | |
| 5,310,451 A | 5/1994 | Tejwani et al. | |
| 5,316,958 A | 5/1994 | Meyerson | |
| 5,340,759 A | 8/1994 | Hsieh et al. | 437/41 |
| 5,346,848 A | 9/1994 | Grupen-Shemansky et al. | |
| 5,374,564 A | 12/1994 | Bruel et al. | |
| 5,399,522 A | 3/1995 | Ohori et al. | |
| 5,413,679 A | 5/1995 | Godbey | |
| 5,426,069 A | 6/1995 | Selvakumar et al. | |
| 5,426,316 A | 6/1995 | Mohammad | |
| 5,442,205 A | 8/1995 | Brasen et al. | |
| 5,461,243 A | 10/1995 | Ek et al. | |
| 5,461,250 A | 10/1995 | Burghartz et al. | 257/347 |
| 5,462,883 A | 10/1995 | Dennard et al. | |
| 5,476,813 A | 12/1995 | Naruse et al. | |
| 5,479,033 A | 12/1995 | Baca et al. | |
| 5,484,664 A | 1/1996 | Kitahara et al. | |
| 5,495,115 A | 2/1996 | Kudo et al. | |
| 5,516,721 A | 5/1996 | Galli et al. | 437/67 |
| 5,523,243 A | 6/1996 | Mohammad | |
| 5,523,592 A | 6/1996 | Nakagawa et al. | |
| 5,534,713 A | 7/1996 | Ismail et al. | |
| 5,536,361 A | 7/1996 | Kondo et al. | |
| 5,540,785 A | 7/1996 | Dennard et al. | |
| 5,596,527 A | 1/1997 | Tomioka et al. | |
| 5,617,351 A | 4/1997 | Bertin et al. | |
| 5,630,905 A | 5/1997 | Lynch et al. | |
| 5,633,202 A | 5/1997 | Brigham et al. | |
| 5,659,187 A | 8/1997 | Legoues et al. | |
| 5,683,934 A | 11/1997 | Candelaria | |
| 5,698,869 A | 12/1997 | Yoshimi et al. | |
| 5,710,450 A | 1/1998 | Chan et al. | |
| 5,714,777 A | 2/1998 | Ismail et al. | |
| 5,728,623 A | 3/1998 | Mori et al. | |
| 5,739,567 A | 4/1998 | Wong | |
| 5,759,898 A | 6/1998 | Ek et al. | |
| 5,777,347 A | 7/1998 | Bartelink | |
| 5,777,364 A | 7/1998 | Crabbe et al. | |
| 5,786,612 A | 7/1998 | Otani et al. | |
| 5,786,614 A | 7/1998 | Chuang et al. | |
| 5,792,679 A | 8/1998 | Nakato | |
| 5,808,344 A | 9/1998 | Ismail et al. | |
| 5,847,419 A | 12/1998 | Imai et al. | 257/192 |
| 5,877,070 A | 3/1999 | Goesele et al. | |
| 5,891,769 A | 4/1999 | Liaw et al. | 438/167 |
| 5,906,708 A | 5/1999 | Robinson et al. | |
| 5,906,951 A | 5/1999 | Chu et al. | |
| 5,912,479 A | 6/1999 | Mori et al. | |
| 5,943,560 A | 8/1999 | Chang et al. | |
| 5,963,817 A | 10/1999 | Chu et al. | |
| 5,966,622 A | 10/1999 | Levine et al. | |
| 5,976,939 A | 11/1999 | Thompson et al. | |
| 5,998,807 A | 12/1999 | Lustig et al. | |
| 6,013,134 A | 1/2000 | Chu et al. | |
| 6,033,974 A | 3/2000 | Henley et al. | |
| 6,033,995 A | 3/2000 | Muller | |
| 6,051,482 A | 4/2000 | Yang | 438/526 |
| 6,058,044 A | 5/2000 | Sugiura et al. | |
| 6,059,895 A | 5/2000 | Chu et al. | |
| 6,074,919 A | 6/2000 | Gardner et al. | |
| 6,096,590 A | 8/2000 | Chan et al. | 438/233 |
| 6,103,559 A | 8/2000 | Gardner et al. | |
| 6,107,653 A | 8/2000 | Fitzgerald | |
| 6,111,267 A | 8/2000 | Fischer et al. | 257/19 |
| 6,117,750 A | 9/2000 | Bensahel et al. | |
| 6,130,453 A | 10/2000 | Mei et al. | |
| 6,133,799 A | 10/2000 | Favors, Jr. et al. | |
| 6,140,687 A | 10/2000 | Shimomura et al. | |
| 6,143,636 A | 11/2000 | Forbes et al. | |
| 6,153,495 A | 11/2000 | Kub et al. | |
| 6,154,475 A | 11/2000 | Soref et al. | |
| 6,160,303 A | 12/2000 | Fattaruso | |
| 6,162,688 A | 12/2000 | Gardner et al. | |
| 6,180,978 B1 | 1/2001 | Chatterjee et al. | 257/327 |
| 6,184,111 B1 | 2/2001 | Henley et al. | |
| 6,191,007 B1 | 2/2001 | Matsui et al. | |
| 6,191,432 B1 | 2/2001 | Sugiyama et al. | |
| 6,194,722 B1 | 2/2001 | Fiorini et al. | |
| 6,204,529 B1 | 3/2001 | Lung et al. | |
| 6,207,977 B1 | 3/2001 | Augusto | |
| 6,210,988 B1 | 4/2001 | Howe et al. | |
| 6,218,677 B1 | 4/2001 | Broekaert | |
| 6,228,694 B1 | 5/2001 | Doyle et al. | |
| 6,232,138 B1 | 5/2001 | Fitzgerald et al. | |
| 6,235,567 B1 | 5/2001 | Huang | |
| 6,235,568 B1 | 5/2001 | Murthy et al. | |
| 6,242,324 B1 | 6/2001 | Kub et al. | |
| 6,249,022 B1 | 6/2001 | Lin et al. | |
| 6,251,755 B1 | 6/2001 | Furukawa et al. | |
| 6,261,929 B1 | 7/2001 | Gehrke et al. | |
| 6,266,278 B1 | 7/2001 | Harari et al. | |
| 6,271,551 B1 | 8/2001 | Schmitz et al. | |
| 6,271,726 B1 | 8/2001 | Fransis et al. | |
| 6,281,532 B1 | 8/2001 | Doyle et al. | |
| 6,291,321 B1 | 9/2001 | Fitzgerald | |
| 6,313,016 B1 | 11/2001 | Kibbel et al. | |
| 6,316,301 B1 | 11/2001 | Kant | |
| 6,323,108 B1 | 11/2001 | Kub et al. | |
| 6,326,664 B1 | 12/2001 | Chau et al. | |
| 6,326,667 B1 | 12/2001 | Sugiyama et al. | |
| 6,329,063 B2 | 12/2001 | Lo et al. | |
| 6,335,546 B1 | 1/2002 | Tsuda et al. | |
| 6,339,232 B1 | 1/2002 | Takagi et al. | |
| 6,350,993 B1 | 2/2002 | Chu et al. | 257/19 |
| 6,368,733 B1 | 4/2002 | Nishinaga et al. | |
| 6,368,925 B2 | 4/2002 | Weon et al. | 438/289 |
| 6,368,946 B1 | 4/2002 | Dekker et al. | 438/488 |
| 6,372,356 B1 | 4/2002 | Thornton et al. | |
| 6,380,013 B2 | 4/2002 | Lee | 438/184 |
| 6,399,970 B2 | 6/2002 | Kubo et al. | |
| 6,403,975 B1 | 6/2002 | Brunner et al. | |
| 6,407,406 B1 | 6/2002 | Tezuka et al. | |
| 6,425,951 B1 | 7/2002 | Chu et al. | |
| 6,429,061 B1 | 8/2002 | Rim | 438/198 |
| 6,436,801 B1 | 8/2002 | Wilk et al. | |
| 6,455,377 B1 | 9/2002 | Zheng et al. | 438/268 |
| 6,482,714 B1 | 11/2002 | Hieda et al. | 438/416 |
| 6,483,156 B1 | 11/2002 | Adkisson et al. | 257/401 |
| 6,492,694 B2 | 12/2002 | Noble et al. | |
| 6,521,041 B2 | 2/2003 | Wu et al. | |
| 6,555,839 B2 | 4/2003 | Fitzgerald | |
| 6,563,152 B2 | 5/2003 | Roberds et al. | |
| 6,583,015 B2 | 6/2003 | Fitzgerald et al. | |
| 6,605,498 B1 | 8/2003 | Murthy et al. | |
| 6,621,131 B2 | 9/2003 | Murthy et al. | |
| 6,657,223 B1 | 12/2003 | Wang et al. | |
| 6,674,149 B2 | 1/2004 | Ohnishi et al. | |
| 6,703,648 B1 | 3/2004 | Xiang et al. | |
| 6,743,684 B2 | 6/2004 | Liu | |
| 6,831,292 B2 * | 12/2004 | Currie et al. | 257/19 |
| 6,876,053 B1 | 4/2005 | Ma et al. | |
| 6,933,518 B2 | 8/2005 | Braithwaite et al. | |
| 7,064,039 B2 | 6/2006 | Liu | |

| | | | |
|---|---|---|---|
| 2001/0003269 A1 | 6/2001 | Wu et al. | |
| 2001/0003364 A1 | 6/2001 | Sugawara et al. | |
| 2002/0014003 A1 | 2/2002 | Asai et al. | |
| 2002/0024395 A1 | 2/2002 | Akatsuka et al. | |
| 2002/0038898 A1 | 4/2002 | Sugiyama et al. | 257/378 |
| 2002/0043660 A1 | 4/2002 | Yamazaki et al. | |
| 2002/0052084 A1 | 5/2002 | Fitzgerald | |
| 2002/0063292 A1 | 5/2002 | Armstrong et al. | |
| 2002/0068393 A1 | 6/2002 | Fitzgerald et al. | |
| 2002/0072130 A1 | 6/2002 | Cheng et al. | |
| 2002/0096717 A1 | 7/2002 | Chu et al. | |
| 2002/0100942 A1 | 8/2002 | Fitzgerald et al. | |
| 2002/0109135 A1 | 8/2002 | Murota et al. | 257/20 |
| 2002/0113294 A1 | 8/2002 | Rhee et al. | 257/616 |
| 2002/0123167 A1 | 9/2002 | Fitzgerald | |
| 2002/0123183 A1 | 9/2002 | Fitzgerald | |
| 2002/0123197 A1 | 9/2002 | Fitzgerald et al. | |
| 2002/0125471 A1 | 9/2002 | Fitzgerald et al. | |
| 2002/0125497 A1 | 9/2002 | Fitzgerald | |
| 2002/0140031 A1 | 10/2002 | Rim | |
| 2002/0158311 A1 | 10/2002 | Ohnishi et al. | 257/591 |
| 2002/0168864 A1 | 11/2002 | Cheng et al. | |
| 2002/0190284 A1 | 12/2002 | Murthy et al. | |
| 2003/0003679 A1 | 1/2003 | Doyle et al. | |
| 2003/0013323 A1 | 1/2003 | Hammond et al. | |
| 2003/0025131 A1 | 2/2003 | Lee et al. | |
| 2003/0057439 A1 | 3/2003 | Fitzgerald | |
| 2004/0007724 A1 | 1/2004 | Murthy et al. | |
| 2004/0014276 A1 | 1/2004 | Murthy et al. | |
| 2004/0070035 A1 | 4/2004 | Murthy et al. | |
| 2004/0084735 A1 | 5/2004 | Murthy et al. | |
| 2004/0119101 A1 | 6/2004 | Schrom et al. | |
| 2004/0142545 A1 | 7/2004 | Ngo et al. | |
| 2004/0173815 A1 | 9/2004 | Yeo et al. | |
| 2005/0116219 A1 | 6/2005 | Braithwaite et al. | |
| 2007/0293003 A1 | 12/2007 | Currie et al. | |
| 2007/0293009 A1 | 12/2007 | Currie et al. | |

FOREIGN PATENT DOCUMENTS

| | | |
|---|---|---|
| DE | 100 11 054 A1 | 9/2000 |
| EP | 0 514 018 | 11/1992 |
| EP | 0 587 520 A1 | 3/1994 |
| EP | 0 683 522 A2 | 11/1995 |
| EP | 0 828 296 | 3/1998 |
| EP | 0 829 908 | 3/1998 |
| EP | 0 838 858 | 4/1998 |
| EP | 0 889 502 A2 | 1/1999 |
| EP | 0 810 124 A2 | 4/1999 |
| EP | 0 910 124 A2 | 4/1999 |
| EP | 1 020 900 A2 | 7/2000 |
| EP | 1 174 928 | 1/2002 |
| FR | 2 701 599 | 8/1994 |
| GB | 2 342 777 | 4/2000 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-094420 | 4/1995 |
| JP | 7-106446 | 4/1995 |
| JP | 7-240372 | 9/1995 |
| JP | 10-270685 | 10/1998 |
| JP | 11-233744 | 8/1999 |
| JP | 2000-21783 | 1/2000 |
| JP | 2000-021783 | 1/2000 |
| JP | 2000-031491 | 1/2000 |
| JP | 2001-319935 | 5/2000 |
| JP | 2001-148473 | 5/2001 |
| JP | 2002-076334 | 3/2002 |
| JP | 2002-164520 | 6/2002 |
| JP | 2002-289533 | 10/2002 |
| WO | WO-98/59365 | 12/1998 |
| WO | WO-99/53539 | 10/1999 |
| WO | WO-00/48239 | 8/2000 |
| WO | WO-00/54338 | 9/2000 |
| WO | WO-01/22482 | 3/2001 |
| WO | WO-01/54202 | 7/2001 |
| WO | WO-01/93338 A1 | 12/2001 |
| WO | WO-01/99169 A2 | 12/2001 |
| WO | WO-02/13262 | 2/2002 |
| WO | WO-02/15244 | 2/2002 |
| WO | WO-02/27783 A1 | 4/2002 |
| WO | WO-02/47168 | 6/2002 |
| WO | WO-02/071488 | 9/2002 |
| WO | WO-02/071491 | 9/2002 |
| WO | WO-02/071495 | 9/2002 |
| WO | WO-02/082514 | 10/2002 |

OTHER PUBLICATIONS

Abstreiter et al., "Strain-Induced Two-Dimensional Electron Gas in Selectively Doped Si1-x Gex Superlattices," 54 Physical Rev. Letters 2441 (1985).

Ahn et al., "Film Stress-related Vacancy Supersaturation in Silicon Under Low-pressure Chemical Vapor Deposited Silicon Nitride Films," 64 J. Applied Physics 4914 (1988).

Antonelli, et al., "Pressure and Strain Effects on Diffusion," 163 Materials Research Soc'y Symp. Proceedings 523 (1990).

Arafa et al., "DC and RF Performance of 0.25 µm p-Type SiGe MODFET," 17 IEEE Electron Device Letters 449 (1996).

Arafa et al., "High Speed P-Type SiGe Modulation-Doped Field-Effect Transistors," 17 IEEE Electron Device Letters 124 (1996).

Arafa et al.,"High-transconductance p-Type SiGe Modulation-doped Field-effect Transistor," 31 Electronics Letters 680 (1995).

Armstrong, "Technology for SiGe Heterostructure-Based CMOS Devices" (1999) (unpublished Ph.D. thesis, Massachusetts Institute of Technology).

Balk, "Surface Properties of Oxidized Germanium-Doped Silicon," 118 J. Electrochemical Soc'y: Solid State Science 494 (1971).

Bean et al, "Gex, Si1-x /Si Strained-layer Superlattice Grown by Molecular Beam Epitaxy," 2 J. Vacuum Sci. & Tech. 436 (1984).

Bean, "Silicon-Based Semiconductor Heterostructures: col. IV Bandgap Engineering," 80 Proceedings of the IEEE 571 (1992).

Bennett et al., "SIMS Depth Profiling of B and As Implants in Si1-x Gex, and Strained Si1-x Gex," Jul. 2004 Electrochemical Soc'y Proceedings 239 (2004).

Bera et al., "Analysis of Carrier Generation Lifetime in Strained-Si/SiGe Heterojunction MOSFETs from Capacitance Transient," 224 Applied Surface Sci. 278 (2004).

Bera et al., "Investigation of Electrical Properties of Furnace Grown Gate Oxide on Strained-Si," 462-63 Thin Solid Films 85 (2004).

Bohg, et al., "Influence of Film Stress and Thermal Oxidation on the Generation of Dislocations in Silicon," 33 Applied Physics Letters 895 (1978).

Boyanov et al., "Growth of Epitaxial CoSi2 on SiGe(001)," 86 J. Applied Physics 1355 (1999).

Brantley, "Calculated Elastic Constants for Stress Problems Associated with Semiconductor Devices," 44 J. Applied Physics 534 (1973).

Bufler, et al., Meinerzhagen, "Hole Transport in Strained Si1-xGex Alloys on Si1-yGey Substrates," 84 J. Applied Physics 5597 (1998).

Bullis, "Silicon Material Properties," in Handbook of Semiconductor Silicon Technology 423 (William C. O'Mara et al. eds., Noyes Publications 1990).

Bulsara, "Optical Interconnects Promised by III-V on-Silicon Integration," Solid State Technology 22 (Aug. 2004).

Bulsara, "SiGe Graded-Layer Technology Ready to be Incorporated into III-V Optical Interconnect Systems," 29 MRS Bulletin 611 (2004).

Cargill et al., "Lattice Compression from Conduction Electrons in Heavily Doped Si:As," 61 Physical Rev. Letters 1748 (1988).

Carns et al., "Chemical Etching of Si1-xGex, in HF:H2O2: CH3000H," 142 J. Electrochemical Soc'y 1260 (1995).

Cea, "Multidimensional Viscoelastic Modeling of Silicon Oxidation and Titanium Silicidation," (1996) (unpublished Ph.D. dissertation, University of Florida).

Cerdeira et al., "Raman Scattering from GexSil-x/Si Strained-layer Superlattices," 45 Applied Physics Letters 1138 (1984).

Chen et al., "DC and RF Characterization of Fully Depleted Strained SOI MOSFETs," 2004 IEEE Int'l SOI Conf. Tech. Dig. 88 (2004).

Cheng et al., "Electron Mobility Enhancement in Strained-Si n-MOSFETs Fabricated on SiGe-on-Insulator (SGOI) Substrates," 22 IEEE Electron Device Letters 321 (2001).

Cheng et al., "Relaxed Silicon-Germanium on Insulator Substrate by Layer Transfer," 30 J. Electronic Materials L37 (2001).

Chidambarrao et al., "Stresses in Si Substrates Near Isolation Trenches," 70 J. Applied Physics 4816 (1991).

Christodoulides et al., "The Recrystallization of Ion-implanted Silicon Layers II. Implant Species Effect," 36 Radiation Effects 73 (1978).

Chu, et al, "A Study of Residual Stress Distribution Through the Thickness of p+ Silicon Films," 40 IEEE Transactions on Electron Devices 1245 (1993).

Chun, et al., "Effective Mass and Mobility of Holes in Strained Sil-xGex Layers on (001) Sil-yGey Substrate," 39 IEEE Transactions on Electron Devices 2153 (1992).

Corni et al., "Solid phase Epitaxial Growth of Ge-Si Alloys Made by Ion Implantation," 71 J. Applied Physics 2644 (1992).

Cowern, et al., "A Model for Coupled Dopant Diffusion in Silicon," 6 Int'l J. Computation and Mathematics in Electrical and Electronic Engineering 59 (1987).

Cowern et al., " iffusion in Strained Si(Ge)," 72 Physical Rev. Letters 2585 (1994).

Cowern et al., "Interdiffusion Mechanisms in Coherently Strained SiGe Multilayers," 96-4 Electrochemical Soc'y Proceedings 195 (1996).

Cullis et al., "Growth Ripples Upon Strained SiGe Epitaxial Layers on Si and Misfit Dislocation Interactions," 12 J. Vacuum Sci. & Tech. A 1924 (1994).

Currie et al., "Carrier Mobilities and Process Stability of Strained Si n- and p-MOSFETs on SiGe Virtual Substrates," 19 J. Vacuum Sci. & Tech. B 2268 (2001).

Currie et al., "Controlling Threading Dislocation Densities in Ge on Si Using Graded SiGe Layers and Chemical Mechanical Polishing," 72 Applied Physics Letters 1718 (1998).

Currie, "SiGe Virtual Substrate Engineering for Integration of III-V Materials, Microelectromechanical Systems, and Strained Silicon MOSFETs with Silicon" (2001) (unpublished Ph.D. thesis, Massachusetts Institute of Technology).

Currie, "Strained Silicon: Engineered Substrates and Device Integration," 2004 Int'l Conf. on Integrated Circuit Design and Tech. 261 (2004).

Daembkes et al., "Fabrication and Properties of n-Channel SiGe/Si Modulation Doped Field-Effect Transistors Grown by MBE," 1985 Int'l Electron Device Meeting Tech. Dig. 768 (1985).

Davidson, et al., "Damage Produced by Ion Implantation in Silicon," in Ion implantation 51 (Fred H. Eisen & Lewis T. Chadderton eds., 1971).

De Wolf et al., "Process-induced Mechanical Stress in Isolation Structures Studied by Micro Raman Spectroscopy," 74 J. Applied Physics 4490 (1993).

De Wolf, "Micro-Raman Spectroscopy to Study Local Mechanical Stress in Silicon Integrated Circuits," 11 Semiconductor Sci. Tech. 139 (1996).

De Wolf, et al., "Stress Measurements in Silicon Devices Through Raman Spectroscopy: Bridging the Gap between Theory and Experiment," 79 J. Applied Physics 7148 (1996).

Dellith et al., "A Dislocation Formation Model of Trench-Induced Dislocations in Dynamic Random Access Memories," 143 J. of the Electrochemical Soc'y 210 (1996).

Ding et al., "Residual Stressed and Mechanical Properties of Boron-doped P+-Silicon Films," A21-23 Sensors and Actuators 866 (1990).

Doerner, et al., "A Method for Interpreting the Data from Depth-sensing Indentation Instruments," 1 J. Material Research 601 (1986).

Dorda, "Piezoresistance in Quantized Conduction Bands in Silicon Inversion Layers," 42 J. Applied Physics 2053 (1971).

Duffy et al, "Effects of High Phosphorus Concentration on Diffusion into Silicon," 115 J. Electrochemical Soc'y 84 (1968).

Eaglesham, et al., "Dislocation-Free Stranski Krastanow Growth of Ge on Si," 64 Physical Rev. Letters 1943 (1990).

EerNisse, "Lateral Stress Measurements in ion-Implanted Metals and Insulators," in Ion Implantation in Semiconductors and Other Materials 531 (Billy L. Crowder ed., 1973).

Eichinger et al., "Characterization of MBE Grown SiGe Superlattices with SIMS and RBS," Proceedings of the First Int'l Symp. on Silicon Molecular Beam Epitaxy 367 (1985).

Erdtmann et al., "Structural Characterization of Strained Silicon Substrates by X-ray Diffraction and Reflectivity," Extended Abstracts of the 2003 Int'l Conf. on Solid State Devices and Materials 290 (2003).

Fahey et al., "Point Defects and Dopant Diffusion in Silicon," 61 Rev. Modem Physics 289 (1989).

Fahey et al., "Stress-induced Dislocations in Silicon Integrated Circuits," 36 IBM J. Research & Dev. 158 (1992).

Fair, "Concentration Profiles of Diffused Dopants in Silicon, in" Impurity Doping Processes in Silicon 315 (1981).

Fair, "Quantified Conditions for Emitter-Misfit Dislocation Formation in Silicon," 125 J. Electrochemical Soc'y: Solid-state Sci. & Tech. 923 (1978).

Fair, "The Effect of Strain-induced Band-gap Narrowing on High Concentration Phosphorus Diffusion in Silicon," 50 J. Applied Physics 860 (1979).

Fang et al., "Calculation of the Fractional Interstitial Component of Boron Diffusion and Segregation Coefficient of Boron in Si0.8Ge0.2," 68 Applied Physics Letters 791 (1996).

Fang al., "Transport Properties of Electrons in Inverted Silicon Surfaces," 169 Physical Rev. 169 (1968).

Fathy et al., "Formation of Epitaxial Layers of Ge on Si Substrates by Ge Implantation and Oxidation," 51 Applied Physics Letters 1337 (1987).

Feenstra, et al., "Scattering from Strain Variations in High-Mobility Si/SiGe Heterostructures," 78 J. Applied Physics 6091 (1995).

Fiorenza et al., "Film Thickness Constraints for Manufacturable Strained Silicon CMOS," 19 Semiconductor Sci. Tech. L4 (2004) (letter to the editor).

Fiorenza et al., "Investigation of Misfit Dislocation Leakage in Supercritical Strained Silicon MOSFETs," Proceedings of the 2004 IEEE International Reliability Physics Symp. 493 (2004).

Fischetti, et al, "Band Structure, Deformation Potentials, and Carrier Mobility in Strained Si, Ge, and SiGe Alloys," 80 .1. Applied Physics 2234 (1996).

Fitzgerald et al., "Dislocation Dynamics in Relaxed Graded Composition Semiconductors," B67 Materials Sci. & Engineering 53 (1999).

Fitzgerald, "Dislocations in Strained-layer Epitaxy: Theory, Experiment, and Applications," 7 Material Sci. Rep. 84 (1991).

Fitzgerald, "GeSi/Si Nanostructures," 25 Annual Rev. of Materials Sci. 417 (1995).

Fitzgerald et al., "MOSFET Channel Engineering Using Strained Si, SiGe, and Ge Channels," Extended Abstracts of the 2002 Int'l Conf. on Solid State Devices and Materials 144 (2002).

Fitzgerald et al., Relaxed GexSil-x "Structures for III- V Integration with Si and High Mobility Two-dimensional Electron Gases in Si," 10 J. Vacuum. Sci. & Tech. B 1807 (1992).

Fitzgerald et al., "Silicon-Based Epitaxial Films for MEMS," 518 Microelectromechanical Structures for Materials Research 233 (1998).

Fitzgerald et al., "Strain-free GexSil-x Layers with Low Threading Dislocation Densities Grown on Si Substrates," 220 Material Resource Soc'y Symp. Proceedings 211 (1991).

Fitzgerald et al., "Totally Relaxed GexSil-x Layers with Low Threading Dislocation Densities Grown on Si Substrates," 59 Applied Physics Letters 811 (1991).

Frank et al., "Diffusion in Silicon and Germanium," in Diffusion in Crystalline Solids 63 (Graeme E. Murch & Arthu S. Nowick eds., 1984).

Frank, "The Interplay of Solute- and Self-diffusion—A key for Revealing Diffusion Mechanisms in Silicon and Germanium," 75 Defect and Diffusion F. 121 (1991).

Fukatsu et al., "SiGe-based Semiconductor-on-insulator Substrate Crated by Low-energy Separation-by-implanted-oxygen," 72 Applied Physics Letters 3485 (1998).

Fukuhara, et al., "Determination of Strain Distributions from X-ray Bragg Reflexion by Silicon Single Crystals," 33 Acta Crystallographica Section a 137 (1977).

Garone et al., "Mobility Enhancement and Quantum Mechanical Modeling in GeSi1-x Channel MOSFETs from 90 to 300 K," 1991 Int'l Electron Device Meeting 29 (1991).

Gates et al., "Epitaxial Si Films on Ge(100) Grown via H/Cl Exchange," 62 Applied Physics Letters 510 (1993).

Gerward, "Implantation-induced Strains in Silicon Studied by X-ray Interferometry and Topography," 37 Phil. Mag. A 95 (1978).

Ghani et al., "Effect of Oxygen on Minority-Carrier Lifetime and Recombination Currents in Si1-xGex, Heterostructure Devices," 58 Applied Physics Letters 1317 (1991).

Ghoshtagore, "Donor Diffusion Dynamics in Silicon," 3 Physical Rev. B 397 (1971).

Ghoshtagore, "Dopant Diffusion in Silicon. III. Acceptors," 3 Physical Rev. B 2507 (1971).

Gibbon et al., "The Effect of Mask Edges on Dopant Diffusion into Semiconductors," 119 J. Electrochemical Soc'y: Solid-State Sci. & Tech. 767 (1972).

Gibbons et al, "Limited Reaction Processing: Silicon Epitaxy," 47 Applied Physics Letters 721 (1985).

Gilliard, et al., "Study of the Dislocation Processes Associated with Strain Relaxation in Si—Ge Heteroepitaxial Films," 84 Zeitschrift fur Metallkunde 874 (1993).

Glück et al., "High fmax n-Type Si/SiGe MODFETs," 33 Electronic Letters 335 (1997).

Godbey et al., "A Si0.7Geo.3 Strained Layer Etch Stop for the Generation of Bond and Etch Back SOI," 1989 IEEE SOS/SOI Tech. Conf. Proceedings 143 (1989).

Goo et al., "Scalability of Strained-Si nMOSFETs Down to 25 nm Gate Length," 24 IEEE Electron Device Letters 351 (2003).

Goroff, et al., "Deformation Potentials in Silicon. III. Effects of a General Strain on Conduction and Valence Levels," 132 Physical Rev. 1080 (1963).

Gronet, et al., "Growth of GeSi/Si strained-layer superlattices using limited reaction processing," J. Appl. Phys.. 61 (6), (Mar. 1987), pp. 2407-2409.

Griltzmacher et al., "Ge Segregation in SiGe/Si Heterostructures and its Dependence on Deposition. Technique and Growth Atmosphere," 63 Applied Physics Letters 2531 (1993).

Hackbarth et al., "Strain Relieved SiGe Buffers for Si-based Heterostructure Field-effect Transistors," 201/202 J. Crystal Growth 734 (1999).

Hargrove et al., "Quantum Mechanical Modeling of the Charge Distribution in a Si/Si1-xGex/Si P-Channel MOSFET," 1994 Int'l Electron Device Meeting Tech. Dig. 735 (1994).

Hensel, et al., "Cyclotron Resonance Experiments in Uniaxially Stressed Silicon: Valence Band Inverse Mass Parameters and Deformation Potentials," 129 Physical Rev. 1041 (1963).

Herbots et al., "Semiconductor-based Heterostructure Formation Using Low Energy Ion Beams: Ion Beam Deposition (IBD) & Combined Ion and Molecular Beam Deposition (C1MD)," in Deposition and Growth: Limits for Microelectronics 259 (G. W. Rugloff ed., American Vacuum Society 1988).

Hobart et al., "Ultra-Cut: A Simple Technique for the Fabrication of S01 Substrates with Ultra-Thin (<5 nm) Silicon Films," Proceedings 1998 IEEE International SOI Conf. 145 (1998).

Höck, et al., "High Hole Mobility in Si0.17Ge0.83 Channel Metal-oxide-semiconductor Field-effect Transistors Grown by Plasma-Enhanced Chemical Vapor Deposition," 76 Applied Physics Letters 3920 (2000).

Höck et al., "High Performance 0.25pm p-Type Ge/SiGe MODFETs," 34 Electronics Letters 1888 (1998).

Holland et al., "Novel Oxidation Process in Ge+– implanted Si and its Effect on Oxidation Kinetics," 51 Applied Physics Letters 520 (1987).

Hollander, et al., "Reduction of Dislocation Density of MBE-Grown Si1-xGEx Layers on (100) Si by Rapid Thermal Annealing," 183 Thin Solid Films 157 (1989).

Horn, "Densitometric and Electrical Investigation of Boron in Silicon," 97 Physical Rev. 1521 (1955).

Houghton, "Strain Relaxation Kinetics in Si1-x Gex/Si Heterostructures," 70 J. Applied Physics 2136.

Hu, "Stress-related Problems in Silicon Technology," 70 J. Applied Physics R53 (1991).

Huang et al., "LOCOS-Induced Stress Effects on Thin-Film SOI Devices," 44 IEEE Transactions on Electron Devices 646 (1997).

Huang et al., "SiGe-on-insulator prepared by wafer bonding and layer transfer for high-performance field-effect transistors," 78 Applied Physics Letters, pp. 1267-1269 (2001).

Hull et al., "Dynamic Observations of Misfit Dislocations in Strained Layer Heterostructures," in Microscopy of Semiconducting Materials 497 (1991).

Hull et al., "Growth of GexSi1-x Alloys on Si(I10) Surfaces," 59 Applied Physics Letters 964 (1991).

Hull et al., "Improvement in Heteroepitaxial Film Quality by a Novel Substrate Patterning Geometry," 60 Applied Physics Letters 1468 (1992).

Hull et al., "Interfacial Structure and Stability in GexSi1-x/Si Strained Layers," 37 Material Resources Soc'y Symp. Proceedings 261 (1985).

Hull et al., "Interpretation of Dislocation Propagation Velocities in Strained GexSi1-x/Si(100) Heterostructures by the Diffusive Kink Pair Model," 70 J. Applied Physics 2052 (1991).

Hull, et al., "Misfit Dislocations in Lattice-Mismatched Epitaxial Films," 17 Critical Rev. In Solid State and Materials Sci. 507 (1992).

Hull et al., "A Phenomenological Description of Strain Relaxation in GexSi1-x/Si(100) Heterostructures," 66 J. Applied Physics 5837 (1989).

Hull et al., "Stability of Semiconductor Strained-layer Superlattices," 48 Applied Physics Letters 56 (1986).

Hull et al., "Structure Imaging of Commensurate GexSi1-x/Si (100) Interfaces and Superlattices," 46 Applied Physics Letters 179 (1985).

Hull et al., "Structural Studies of GeSi/Si Heterostructures," Proceedings of the First Int'l Symp. on Silicon Molecular Beam Epitaxy 376 (1985).

Hwang et al., "Performance of 70nm Strained-Silicon CMOS Devices," 2003 Symp. on VLSI Tech. Dig. of Tech. Papers 103 (2003).

Ishikawa et aI., "SiGe-on-insulator Substrate Using SiGe Alloy Grown Si(001)," 75 Applied Physics Letters 9 (1999).

Ismail, "Effect of Dislocations in Strained Si/SiGe on Electron Mobility," 14 J. Vacuum Sci. & Tech. 2776 (1996).

Ismail et al., "Electron Transport Properties of Si/SiGe Heterostructures: Measurements and Device Implications," 63 Applied Physics Letters 660 (1993).

Ismail et al., "Extremely High Electron Mobility in Si/SiGe Modulation-doped Heterostructures," 66 Applied Physics Letters 1077 (1995).

Ismail et al., "Gated Hall Effect Measurements in High-Mobility n-Type Si/SiGe Modulation Doped Heterostructures," 66 Applied Physics Letters 842 (1995).

Ismail et al., "High Electron Mobility in Modulation-doped Si/SiGe," 58 Applied Physics Letters 2117 (1991).

Ismail et al., "High Hole Mobility in SiGe Alloys for Device Applications," 64 Applied Physics Letters 3124 (1994).

Ismail et al., "High-Transconductance n-Type Si/SiGe Modulation-Doped Field-Effect Transistors," 13 IEEE Electron Device Letters 229 (1992).

Ismail, "Identification of a Mobility-Limiting Scattering Mechanism in Modulation-Doped Si/SiGe Heterostructures," 73 Physical Rev. Letters 3447 (1994).

Iyer, et al., "Thermal Relaxation of Pseudomorphic Si-Ge Superlattices by Enhanced Diffusion and Dislocation Multiplication," 65 J. Applied Physics 4693 (1989).

Jackson et al., "Undoped SiGe Heterostructure Field Effect Transistors," 40 IEEE Transactions on Electron Devices 2104 (Nov. 1993).

Jain, et al., "Structure, Properties and Applications of Gex/Si1-x a Strained Layers and Superlattices," 6 Semiconductor Sci. & Tech. 547 (1991).

Jesson et al., "Interplay between Evolving Surface Morphology, Atomic-scale Growth Modes, and Ordering during Si1-xGex Epitaxy," 70 Physical Rev. Letters 2293 (1993).

John et al., "Strained Si n-Channel Metal-oxide-semiconductor Transistor on Relaxed Si1-x GexFormed by Ion Implaritation of Ge," 74 Applied. Physics Letters 2076 (1999).

Jones et al, "An Advanced Calibration Method for Modelling Oxidation and Mechanical Stress in Sub-Micron CMOS Isolation Structures," 1994 Int'l Electron Device Meeting Tech. Dig. 877 (1994).

Jorke et al., "Mobility Enhancement in Modulation Doped Si- Si1-x GEx Superlattice Grown by Molecular Beam Epitaxy," Proceedings of the First Int'l Symp. on Silicon Molecular Beam Epitaxy 352 (1985).

Joshi, et al., "Diffusion-Induced Imperfections in Silicon," 112 J. Elecrochemical Soc'y 185 (1965).

Jung et al., "Effect of Thermal Processing on Mobility in Strained Si/Strained Si1-yGey, on Relaxed Si1-yGey, (x<y) Virtual Substrates," 84 Applied Physics Letters 3319 (2004).

Jung et al., "Implementation of Both High-Hole and Electron Mobility in Strained Si/Strained Si1-yGey Relaxed Si1-xGex (x<y) Virtual Substrate," 24 IEEE Electron Device Letters 460 (2003).

Kao et al., "Two-dimensional Thermal Oxidation of Silicon—II. Modeling Stress Effects in Wet Oxides," ED-35 IEEE Transactions on Electron Devices 25 (1988).

Karmanov et al., "Influence of Radiation Defects on Impurity Diffusion in Silicon," 11 Soviet Physics and Semiconductors 1096 (1978).

Kasper et al., "A One-Dimensional SiGe Superlattice Grown by UHV Epitaxy," 8 Applied Physics A: Materials Sci. & Processing 199 (1975).

Kasper et al., "An Industrial Single slice Si-MBE Apparatus," 136 J. Electrochemical Soc'y 1 154 (1989).

Kasper, "Growth and Properties of Si/SiGe Superlattices," 174 Surface Sci. 630 (1986).

Kasper, et al., "Elastic Strain and Misfit Dislocation Density in Si0.92Ge0.08 Films on Silicon Substrates," 44 Thin Solid Films 357 (1977).

Kasper, et al., "Stability of Strained-Layer Superlattices," in Strained-Layer Superlattices: Materials Sci. & Tech. 240 (Thomas P. Pearsall ed., Academic Press, Inc. 1991).

Kearney, et al., "The Effect of Alloy Scattering on the Mobility of Holes in a Si1-xGex Quantum Well," 13 Semiconductor Sci. & Tech. 174 (1998).

Kissinger et al., "Stepwise Equilibrated Graded GexSi1-x Buffer with Very Low Threading Dislocation Density on Si(001)," 66 Applied Physics Letters 2083 (1995).

Klauk et al., "Thermal Stability of Undoped Strained Si Channel SiGe Heterostructures," 68 Applied Phys.ics Letters 1975 (1996).

Kleinman, "Deformation Potentials in Silicon. I. Uniaxial Strain," 128 Physical Rev. 2614 (1962).

Kleinman, "Deformation Potentials in Silicon. II. Hydrostatic Strain and the Electron-Phonon Interaction," 130 Physical Rev. 2283 (1963).

Kloeck, et al., "Mechanical Sensors," in Semiconductor Sensors 153 (1994).

Kohli et al., "Ultra-Shallow Junction Formation in Strained Si/Si 1-xGex Using Flash Assist Rta," Jul. 2004 Electrochemical Soc'y Proceedings 1113 (2004).

König et al., "Enhancement Mode n-Channel Si/SiGe MODEFET with High Intrinsic Transconductance," 28 Electronics Letters 160 (1992).

König et al., "N-Channel Si/SiGe MODFET's: Effects of Rapid Thermal Activation on the DC Performance," 14 IEEE Electron Device Letters 97 (1993).

König, et all, "p-Type Ge-Channel MODFET's with High Transconductance Grown on Si Substrates," 14 IEEE Electron Device Letters 205 (1993).

Königh, et al., "p-Type SiGe Channel Modulation Doped Field-effect Transistors with Post-evaporation Patterned Submicrometre Schottky Gates," 29 Electronic Letters 486 (1993).

König, et al., "Si/SiGe Modulation Doped Field-Effect Transistor with Two Electron Channels," 27 Electronics Letters 1405 (1991).

Kringhøj et al., "Diffusion of Sb in Strained and Relaxed Si and SiGe," 76 Physical Rev. Letters 3372 (1996).

Kuo et al., "Boron Diffusion in Si and Si1-xGex," 379 Materials Research Symp. Proceedings 373 (1995).

Kuo et al., "Comparison of Boron Diffusion in Si and Strained Si1-xGex, Epitaxial Layers," 62 Applied Physics Letters 612 (1993).

Kuo et al., "Effects of Si Thermal Oxidation on B Diffusion in and Strained Si1-yGex Layers," 67 Applied Physics Letters 706 (1995).

Kuo, "Effects of Strain on Boron Diffusion in Si and Si1-xGex," 66 Applied Physics Letters 580 (1995).

Kuroi et al., "Stress Analysis of Shallow Trench Isolation for 256MDRAM and Beyond," 1998 Int'l Electron, Device Meeting Tech. Dig. 141 (1998).

Laikhtman, et al., "Theoretical Hole Mobility in a Narrow Si/SiGe Quantum Well," 47 Physical Rev. B 515 (1993).

Lander et al., "On the Low-temperature Mobility of Holes in Gated Oxide Si/SiGe Heterostructures," 12 Semiconductor Sci. & Tech. 1064 (1997).

Langdo et al. "Strained Si on Insulator Technology: From Materials to Devices," 48 Solid State Electronics 1357 (2004).

Langdo et al., "Advanced SiGe free Strained Si on Insulator Substrates: Thermal Stability and Carrier Mobility Enhancement," Extended Abstracts of the 2003 Int'l Conf. on Solid State Devices and Materials 814 (2003).

Langdo et al., "Preparation of Novel SiGe-Free Strained Si on Insulator Substrates," 2002 IEEE Int'l SOI Conf. 211 (2002).

Langdo et al., "SiGe free Strained Si on Insulator by Wafer Bonding and Layer Transfer," 82 Applied Physics Letters 4256 (2003).

Larsen, et al., "Diffusion in Relaxed and Strained SiGe Layers," T69 Physica Scripta 92 (1997).

Larsen, et al., "Diffusion of Sb in Relaxed Si1-xGex," 68 Applied Physics Letters 2684 (1996).

Lauer et al., "Fully Depleted n-MOSFETs on Supercritical Thickness Strained SOI," 25 IEEE Electron Device Letters 83 (2004).

Law, et al., "Continuum Based Modeling of Silicon Integrated Circuit Processing: An Object Oriented Approach," 12 Computational Materials Sci. 289 (1998).

Lawrence, "Solute Diffusion in Plastically Deformed Silicon Crystals," 18 British J. Applied Physics 405 (1967).

Lee et al., "Optimized Strained Si/Strained Ge DualChannel Heterostructures for High Mobility P- and N-MOSFETs," 2003 Int'l Electron Device Meeting Tech. Dig. 429 (2003).

Lee et al., "Strained Ge Channel p-Type Metal-oxide-semiconductor Field-effect Transistors Grown on Si1-x Gex/Si Virtual Substrates," 79 Applied Physics Letters 3344 (2001).

Lee, e al., "Strained Si, SiGe, and Ge Channels for High-mobility Metal-oxide-semiconductor Field-effect Transistors," 9 J. Applied Physics 011101-1 (2005).

LeGoues et al., "Anomalous Strain Relaxation in SiGe Thin Films and Superlattices," 66 Physical Rev. Letters 2903 (1991).

Leitz et al., "Dislocation Glide and Blocking Kinetics in Compositionally Graded SiGe/Si," 90 J. Applied Physics 2730 (2001).

Leitz, "A High Throughput, Ultra-low Roughness, SiGe-free Strained Si Regrowth Process," 8 Materials Sci. in Semiconductor Processing 187 (2004).

Leitz et al., "Hole Mobility Enhancements in Strained Si/ Si1-yGey p-type Metal-oxide-semiconductor Field-effect Transistors Grown on Relaxed Si1-xGex (x<y) Virtual Substrates," 79 Applied Physics Letters 4346 (2001).

Lim et al., "A Study of the Oxidation Behavior and the Postannealing Effect in a Graded SiGe/Si Heterostructure," 31 J. Electronic Materials 529 (2002).

Linder et al., "Reduction of Dislocation Density in Mismatched SiGe/Si Using a Low-Temperature Si Buffer Layer," 70 Applied Physics Letters 3224 (1997).

Liu, et al., "Interplay of Stress, Structure, and Stoichiometry in Ge-Covered Si(001)," 76 Physical Rev. Letters 3156 (1996).

Liu et al., "Wet Oxidation of GeSi" at 700°C, 71 J. Applied Physics 4015 (1992).

Loechelt et al., "Measurement and Modeling of Boron Diffusion in Si and Strained Si1-x GEx, Epitaxial Layers During Rapid Thermal Annealing," 74 J. Applied Physics 5520 (1993).

Lu et al., "Pressure-enhanced Crystallization Kinetics of Amorphous Si and Ge: Implications for Point-defect Mechanisms," 70 J. Applied. Physics 5323 (1991).

Maiti et al., "Hole Mobility Enhancement in Strained-Si p-MOSFETs Under High Vertical Field," 41 Solid State Electronics 1863 (1997).

Maleville et al., "Physical Phenomena Involved in the Smart-Cut Process," 96-3 Electrochemical Soc'y Proceedings 34 (1996).

Manasevit et al., "Electron Mobility Enhancement in Epitaxial Multilayer Si-Sil-xGex Alloy Films on (100) Si," 41 Applied Physics Letters 464 (1982) G. Schuberth et al., "High Electron Mobility in Modulation-Doped Si/SiGe Quantum well Structures," 59 Applied Physics Letters 3318 (1991).

Matthews, et al., "Defects in Epitaxial Multilayers," 27 J. Crystal Growth 118 (1974).

McNeill et al., "Low Temperature Epitaxial Silicon Growth in a Rapid Thermal Processor," 224 Materials Research Soc'y Symp. Proceedings 235 (1991).

McQuhae, et al., "The Lattice Contraction Coefficient of Boron and Phosphorus in Silicon," 15 Solid State Electronics 259 (1972).

Meyerson et al., "Cooperative Growth Phenomena in Silicon/Germanium Low-Temperature Epitaxy," 53 Applied Physics Letters 2555 (1988).

Meyerson, "Low-temperature Si and Si: Ge Epitaxy by Ultrahighvacuum/Chemical Vapor Deposition: Process Fundamentals," 34 IBM J. Research & Dev. 806 (1990).

Meyerson, "UHV/CVD Growth of Si and Si:Ge Alloys: Chemistry, Physics, and Device Applications," 80 Proceedings of the IEEE 1592 (1992).

Mii et al., "Extremely High Electron Mobility in Si/GexSil-x Structures Grown by Molecular Beam Epitaxy," 59 Applied Physics Letters 1611 (1991).

Mizuno, "Electron and Hole Mobility Enhancement in Strained-Si MOSFET's on SiGe-on-Insulator Substrates Fabricated by SJMOX Technology," 21 IEEE Electron Device Letters 230 (2000).

Mizuno et al., "Advanced SOI-MOSFETs with Strained-Si Channel for High Speed CMOS Electron/Hole Mobility Enhancement," 2000 Symp. on VLSI Tech. Dig. of Tech. Papers 210 (2000).

Mizuno et al., "High Performance Strained-Si p-MOSFETs on SiGe-on-Insulator Substrates Fabricated by SIMOX Technology," 1999 Int'l Electron Device Meeting Tech. Dig. 934 (1999).

Mizuo, et al., "Investigation of Point Defects in Si by Impurity Diffusion," 36 Material Resources Soc'y Symp. Proceedings 125 (1985).

Mizuo, et al., "Suppression by Pre-Diffusion Annealing of Anomalous Diffusion of B and P in Si Directly Masked with Si3N4 Films," 20 Japanese J. Applied Physics 1749 (1981).

Monroe et al., "Comparison of Mobility-Limiting Mechanisms in Highmobility Sil-xGex Heterostructures," 11 J. Vacuum Sci. & Tech. B 1731 (1993).

Morin, et al., "Electrical Properties of Silicon Containing Arsenic and Boron," 96 Physical Rev. 28 (1954).

Moriya et al., "Boron Diffusion in Strained Sil-xGex Epitaxial Layers," 71 Physical Rev. Letters 883 (1993).

Mukhhopadhyay et al., "Properties of SiGe Oxides Grown in a Microwave Oxygen Plasma," 78 J. Applied Physics 6135 (1995).

Nabarro, "Theory of Crystal Dislocations" (Dover Publications Inc. 1967).

Nayak, "High-Mobility Strained-Si PMOSFET's," 43, IEEE Transactions on Electron Devices 1709 (1996).

Nayak et al., High-mobility p-Channel Metal-oxide-semiconductor Field-effect Transistor on Strained Si, 62 Applied Physics Letters 2853 (1993).

Nayak, et al., "Low-field Hole Mobility of Strained Si on (100) Sil-xGex Substrate," 64 Applied Physics Letters 2514 (1994).

Nelson et al., "Room-temperature Electron Mobility in Strained Si/SiGe Heterostructures," 63 Applied Physics Letters 367 (1993).

Nichols et al., "Mechanisms of Dopant Impurity Diffusion in Silicon," 40 Physical Rev. B 5484 (1989).

Nikanorov et al., "Elastic Properties of Silicon," 13 Soviet Physics—Solid State 2516 (1972).

Ning, "Distribution of Residual Stresses in Boron Doped p+ Silicon Films," 143 J. Electrochemical Soc'y 3389 (1996).

Noble et al, "Reduction in Misfit Dislocation Density by the Selective Growth of Sil-xGex/Si in Small Areas," 56 Applied Physics Letters 51 (1990).

Noble et al., "Thermal Stability of Si/ Sil-xGex/Si Heterojunction Bipolar Transistor Structures Grown by Limited Reaction Processing," 55 Applied Physics Letters 1978 (1989).

O'Neill et al., "SiGe Virtual Substrate N-Channel Heterojunction MOSFETs," 14 Semiconductor Sci. Tech. 784 (1999).

Oberhuber et al., "Subband Structure and mobility of Two-dimensional Holes in Strained Si/SiGe MOSFET's," 58 Physical Rev. B 9941 (1998).

Olsen et al, "High performance nMOSFETs Using a Novel Strained Si/SiGe Cmos Architecture," 50 IEEE Transactions on Electron Devices 1961 (2003).

Osada et al., "Effect of Stress in the Deposited Silicon Nitride Films on Boron Diffusion of Silicon," 142 J. Electrochemical Soc'y 202 (1995).

Patton, "Silicon-Germanium-Base Heterojunction Bipolar Transistors by Molecular Beam Epitaxy," 9 IEEE Electron Device Letters 165 (1988).

Paul et al., "Electrical Properties and Uniformity of Two Dimensional Electron Gases Grown on Cleaned SiGe Virtual Substrates," 16 J. Vacuum Sci. & Tech. 1644 (1998).

People, "Physics and Applications of GexSil-x/Si Strained-Layer Heterostructures," QE-22 IEEE Journal of Quantum Mechanics 1696 (1986).

People, et al., "Band Alignments of Coherently Strained GexSil-x/Si Heterostructures on <001 > Gey/Sil-y Substrates," 48 Applied Physics Letters 538 (1986).

People et al., "Modulation Doping in GexSil-x/Si Strained Layer Heterostructures," 45 Applied Physics Letters 1231 (1984).

People et al., "Modulation Doping in Ge(x)Si(1 x)/Si Strained Layer Heterostructures: Effects of Alloy Layer thickness, Doping Setback, and Cladding Layer Dopant Concentration," 3 J. Vacuum Sci. & Tech. A 846 (1985).

People et al., "Temperature Dependence of Hole Mobilities in Selectively Doped Ge(x)Si(1-x)/Si Strained Layer Heterojunctions," Proceedings of the First Int'l Symp. on Silicon Molecular Beam Epitaxy 360 (1985).

Perera et al., "Trench Isolation for 0.45 pm Active Pitch and Below," 1995 Int'l Electron Device Meeting 679 (1995).

Petersan, "Silicon as a Mechanical Metal," 70 Proceedings of the IEEE 420.

Pruijmboom et al., "Heterojunction Bipolar Transistors with Sil-x Gex, Base," 19 Micróelectronic Engineering 427 (1994).

Prussin, "Generation and Distribution of Dislocations by Solute Diffusion," 32 J. Applied Physics 1876 (1961).

Rafferty, "Stress Effects in Silicon Oxidation—Simulation and Experiments," (1989) (unpublished Ph.D. dissertation, Stanford University).

Ransom et al., "Gate-Self-Aligned n-Channel and p-Channel Germanium MOSFET's," 38 IEEE Transactions on Electron Devices 2695 (1991).

Rieger, et al., "Electronic-band Parameters in Strained Sil-xGex Alloys on Sil-yGey Substrates," 48 Physical Rev. 276 (1993).

Rim, "Fabrication and Analysis of Deep Submicron Strained-Si N-MOSFET's," 47 IEEE Transactions on Electron Devices 1406 (200).

Rim et al., "Characteristics and Device Design of Sub-100 nm Strained Si N- and PMOSFETs," 2002 Symp. on VLSI Tech. Dig. of Tech. Papers 98 (2002).

Rim et al., "Enhanced Hole Mobilities in Surface-channel Strained-Si pMOSFETs," 1995 Int'l Electron Device Meeting Tech. Dig. 517 (1995).

Rim et al., "Transconductance Enhancement in Deep Submicron Strained-Si n-MOSFETs," 1998 Int'l Electron Device Meetings 707 (1998).

Ringel et al., "III-V Space Solar Cells on Si Substrates Using Graded GeSi Buffers," 16th European Photovoltaic Solar Energy Conf. Tech. Dig. 939 (2000).

Rosenberg, et al., "Self-Aligned Germanium MOSFET's Using a Nitrided Native Oxide Gate Insulator," 9 IEEE Electron Device Letters 639 (1988).

Rueda et al., "Mechanical Stress Modeling for Silicon Fabrication Processes," 1997 International Conf. on Simulation of Semiconductor Processes and Devices Dig. 53 (1997).
Rueda, et al., "Modeling of Strain in Boron-Doped Silicon Cantilevers," 1998 International Conf. on Modeling and Simulation of Microsystems, Semiconductors, Sensors and Actuators 94 (1998).
Sabnis, et al., "Characterization of the Electron Mobility in the Inverted <100> Si Surface," 1979 Int'l Electron Device Meeting 18 (1979).
Sadeghzadeh et al., "Wave Function-dependent Mobility and Suppression of Interface Roughness Scattering in a Strained SiGe p-Channel Field-effect Structure," 76 Applied Physics Letters 2568 (200).
Saino et al.,"Conto1 of Trench Stress in Bias ECR-CVD Oxide-Filled STI for Enhanced DRAM Data Retention Electron Time," 1998 Int'l Electron Device Meeting Tech. Dig. 149 (1998).
Samavedam et al., "High-quality Germanium Photodiodes Integrated on Silicon Substrates Using Optimized Relaxed Graded Buffers," 73 Applied Physics Letters 2125 (1998).
Samavedam, et al., "Novel Dislocation Structure and Surface Morphology Effects in Relaxed Ge/SI-Ge(graded)/Si Structures," 81 J. Applied Physics 3108 (1997).
Samavedam et al., "Relaxation of Strained Si Layers Grown on SiGe Buffers," 17 J. Vacuum Sci. & Tech. B 1424 (1999).
Schäffler, "High-mobility Si and Ge Structures," 12 Semiconductor Sci. Tech. 1515 (1997).
Schäffler et al., "High-electron-mobility Si/SiGe Heterostructures: Influence of the Relaxed SiGe Buffer Layer," 7 Semiconductor Sci. Tech. 260 (1992) (letter to the editor).
Schonenberg et al., "The Stability of Sil-xGex Strained Layers on Small-area Trench-isolation Silicon," 12 J. Material Research 364 (1997).
Schwuttke et al., "High Energy Nitrogen Doping of Single-Crystal Silicon," Proceedings of the 1967 Santa Fe Conf. on Radiation Effects in Semiconductors 406 (1968).
Senez et al., "Two-dimensional Simulation of Local Oxidation of Silicon: Calibrated Viscoelastic Flow Analysis," 43 IEEE Transactions on Electron Devices 720(1996).
Serebrinsky, "Stress Concentration in Silicon-Insulator Interfaces," 13 Solid-State Electronics 1435 (1970).
Sharma, "Diffusion in Silicon and Germanium," 70 & 71 Defect & Diffusion F. 1 (1990).
Sinha et al., "Thermal Stresses and Cracking Resistance of Dielectric Films (SiN, Si3N4, and SiO2) on Si Substrates," 49 J. Applied Physics 2423 (1978).
Smeys et al., "Influence of Process-induced Stress on Device Characteristics and its Impact on Scaled Device Performance," 46 IEEE Transactions on Electron Devices 1245 (1999).
Smith, "Piezoresistance Effect in Germanium and Silicon," 94 Physical Rev. 42 (1954).
Steegen et al., "Silicide Induced Pattern Density and Orientation Dependent Transconductance in MOS Transistors," 1999 Int'l Electron Device Meeting Tech. Dig. 497 (1999).
Stern, et al., "Charge Transfer and Low-temperature Electron Mobility in a Strained Si Layer in Relaxed Sil-xGex," 61 Applied Physics Letters 1110 (1992).
Stiffler, "Oxidation-induced Substrate Strain in Advanced Silicon Integrated-circuit Fabrication," 68 J. Applied Physics 351 (1990).
Streetman, "Solid State Electronic Devices" (4th ed., Prentice Hall 1995).
Subbanna et al., "How SiGe Evolved into a Manufacturable Semiconductor Production Process," 1999 IEEE International Solid-State Conf. 66 (1999).
Subbanna et al., "Si/SiGe p-Channel MOSFETs," 1991 Symp. on VLSI Tech. Dig. of Tech. Papers 103 (1991).
Sugii, "Thermal Stability of the Strained-Si/Si0.7Ge0.3 Heterostructure," 89 J. Applied Physics 6459 (Jun. 1, 2001).
Sugii et al., "High Electron Mobility in Strained Si Channel of Sil-xGex/Si/Sil-xGex Heterostructure with Abrupt Interface," 13 Semiconductor Sci. Tech. A140 (1998).
Sugii et al., "Role of Sil-xGex Buffer Layer on Mobility Enhancement in a Strained-Si n-Channel Metal-Oxide-Semiconductor Field-Effect Transistor," 75 Applied Physics Letters 2948 (Nov. 8 1999).

Sugiyama et al., "Formation of Strained-Silicon Layer on Thin Relaxed SiGe/SiO2/Si Structure Using SIMOX Technology," 369 Thin Solid Films 199 (2000).
Sun, et al., "Electron Mobility in Inversion and Accumulation Layers on Thermally Oxidized Silicon Surfaces," ED-27 IEEE Transactions on Electron Devices 1497 (1980).
T Fiory et al., "Thermal Relaxation of Metastable Strained-layer GexSi 1 -x/Si Epitaxy," 31 Physical Rev. B 4063 (1985).
Takagi et al., "Characterization of Inversion-Layer Capacitance of Holes in Si MOSFET's," 46 IEEE Transactions on Electron Devices 1446 (1999).
Takagi et al., "Comparative Study of Phonon-limited Mobility of Two-dimensional Electrons in Strained and Unstrained Si Metal-oxide-semiconductor Field-effect Transistors," 80 J. Applied Physics 1567 (1996).
Takagi et al., "Mobility Enhancement of SOI MOSFETs due to Subband Modulation in Ultrathin SOI Films," 37 Japan J. Applied Physics 1289 (1998).
Takagi et al., "On the Universality of Inversion Layer Mobility in Si MOSFET's: Part 1—Effects of Substrate Impurity Concentration," 41 IEEE Transactions on Electron Devices 2357 (1994).
Takagi et al., "On the Universality of Inversion Layer Mobility in Si MOSFET's: Part II—Effects of Surface Orientation," 41 IEEE Transactions on Electron Devices 2363 (1994).
Tamaki et al., "Evaluation of Dislocation Generation at Si3N4 Film Edges on Silicon Substrates by Selective Oxidation," 128 J. Electrochemical Soc'y 644 (1981).
Taraschi et al., "Relaxed SiGe on Insulator Fabricated via Wafer Bonding and Layer Transfer: Etch-back and Smart-cut Alternatives," 2001-3 Electrochemical Soc'y Proceedings 27 (2001).
Taraschi et al., "Relaxed SiGe-on-insulator Fabricated via Wafer Bonding and Etch Back," 20 J. Vacuum Sci. & Tech. B 725 (2002).
Taraschi et al., "Strained-Si-on-Insulator (SSOI) and SiGe-on Insulator SGOI): Fabrication Obstacles and Solutions," 745 Material Resources Soc'y p Proceedings 105 (2003).
Teng et al., "Optimization of Sidewall Masked Isolation Process," 32 IEEE Transactions on Electron Devices 124 (1985).
Todokoro, et al., "The Stress-enhanced Diffusion of Boron in Silicon," 49 J. Applied Physics 3527 (1978).
Todorov et al., "Direct Formation of Dielectric Thin Films on Silicon by Low Energy Ion Beam Bombardment," 36 Vacuum 929 (1986).
Tong, et al., "Semiconductor Wafer Bonding: Science and Technology," (John Wiley & Sons, Inc. 1999).
Tsang et al., "Measurements of Alloy Composition and Strain in Thin GexSi I- x Layers," 75 J. Applied Physics 8098 (1994).
Tuppen et al., "LowsThreadsing Dipslocatedion Densities inThick, Relaxed Sil-xGex Buffer Layers," 220 Material Resources Soc'y Symp. Proceedings 187 (1991).
Tuppen et al., "Relaxation Processes in Si/Sil-xGex Strained Layer Superlattices—A Study by Raman Spectroscopy and X-ray Diffractometry," Proceedings of the Second Int'l Symp. on Silicon Molecular Beam Epitaxy 36 (1988).
Tweet et al., "Factors Determining the Composition of Strained GeSi Layers Grown with Disilane and Germane," 65 Applied Physics Letters 2579 (1994).
Van de Walle et al., "Germanium Diffusion and Strain Relaxation in Si/ Sil-xGex Structures," 183 Thin Solid Films 183 (1989).
Van de Walle, "Theoretical Calculations of Heterojunction Discontinuities in the Si/Ge System," 34 Physical Rev. B 5621 (1986).
van der Merwe, "Structure of Epitaxial Crystal Interfaces," 31 Surface Sci. 198 (1972).
van der Merwe, et al., "Energy of Interfaces between Crystals, in" Epitaxial Growth Part B 493 (J. W. Matthews ed., 1975).
Vancauwenberghe et al., "New SiGe Dielectrics Grown at Room Temperature by Low-energy Ion Beam Oxidation and Nitridation," 59 Applied Physics Letters 2031 (1991).
Verdonckt-Vandebroek et al., "High-Mobility Modulation-Doped Graded SiGe-Channel p-MOSFET's," 12 IEEE Electron Device Letters 447 (1991).
Vogelsang, et al., "Electron Transport in Strained Si Layers on Sil-xGex, Substrates," 63 Applied Physics Letters 186 (1993).

Wang et al., "Substrate-Strained Silicon Technology: Process Integration," 2003 Int'l Electron Device Meeting Tech. Dig. 61 (2003).

Washburn et al., "Defect Formation in Epitaxial Crystal Growth," 20 J. Electronic Materials 155 (1991).

Watanabe et al., "Invited: Perfect Crystal Device Technology," 44 J. of the Japan Society of Applied Physics 269 (Supp. 1975).

Watkins et al., "Lattice Vacancies and Interstitials in Silicon," in Defects and Radiation Effects in Semiconductors 1978 16 (1979).

Watt, et al., "Universal Mobility-Field Curves for Electrons and Holes in MOS Inversion Layers," 1987 Symp. on VLSI Tech. Dig. of Tech. Papers 81 (1987).

Welser, "The Application of Strained-Silicon/Relaxed-Silicon Germanium Heterostructures to Metal-oxidesemiconductor Field-effect Transistors," (1994) (unpublished Ph.D. dissertation, Stanford University).

Welser et al., "Electron Mobility Enhancement in Strained-Si N-Type Metal Oxide-Semiconductor Field-Effect-Transistors," 15 IEEE Electron Device Letters 100 (1994).

Weiser et al., "NMOS and PMOS Transistors Fabricated in Strained Silicon/Relaxed Silicon-Germanium Structures," 1992 Int'l Electron Device Meeting Tech. Dig. 1000 (1992).

Welser et al., "Strain Dependence of the Performance Enhancement in Strained-i n-MOSFETs," 1994 Int'l Electron Device Meeting Tech. Dig. 373 (1994).

Westhoff et al., "A Novel, High Quality SiGe Graded Buffer Growth Process Using GeC14," Jul. 2004 Electrochemical Soc'y Proceedings 589 (2004).

Williams, "The Significance of Ion Implantation Induced Stress in Silicon," 60A Physics Letters 330 (1977).

Willis, "The Energy of an Array of Dislocations: Implications for Strain Relaxation in Semiconductor Heterostructures," 62 Phil. Mag. A 115 (1990).

Willoughby et al., "Diffusion of Boron in Heavily Doped n- and p-Type Silicon," 59 J. Applied Physics 2392 (1986).

Wortman et al., "Effect of Mechanical Stress on p-n Junction Device Characteristics," 35 J. Applied Physics 2122 (1964).

Wortman, et al., "Effect of Mechanical Stress on p-n. Junction Device Characteristics. II. Generation-Recombination Current," 37 J. Applied Physics 3527 (1966).

Wortman, et al., "Young's Modulus, Shear Modulus, and Poisson's Ratio in Silicon and Germanium," 36 J. Applied Physics 153 (1965).

Wu, "Novel Etch-Stop Materials for Silicon Micromachining," (1997) (unpublished MA thesis, Masshusetts Institute of Technology).

Xie et al., "Semiconductor Surface Roughness: Dependence on Sign and Magnitude of Bulk Strain," 73 Physical Rev. Letters 3006 (1994).

Xie et al., "Very High Mobility Two-dimensional Hole Gas in $Si/Ge_xSi_{1-x}$/Ge Structures Grown by Molecular Beam Epitaxy," 63 Applied Physics Letters 2263 (1993).

Yang, et al., "The Quantitative Determination of the Residual Stress Profile in Oxidized $p^+$ Silicon Films," 54 Sensors and Actuators A 684 (1996).

European Patent Office Communication pursuant to Article 96(2) EPC for Application No. 02786360.4-1528, (Mar. 15, 2006), 4 pages.

Gannavaram, et al., "Low Temperature ($\leq 800°C$) Recessed Junction Selective Silicon-Germanium Source/Drain Technology for sub-70 nm CMOS," *IEEE International Electron Device Meeting Technical Digest*, (2000), pp. 437-440.

Ge et al., "Process-Strained Si (PSS) CMOS Technology Featuring 3D Strain Engineering," *IEEE International Electron Devices Meeting Technical Digest*, (2003) pp. 73-76.

Ghani etal., "A 90nm High vol. Manufacturing Logic Technology Featuring Novel 45nm Gate Length Strained Silicon CMOS Transistors," *IEEE International Electron Devices Meeting Technical Digest*, (2003), 978-980.

Hamada etal., "A New Aspect of Mechanical Stress Effects in Scaled MOS Devices," *IEEE Transactions on Electron Devices*, vol. 38, No. 4 (April 1991), pp. 895-900.

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448-450.

Iida et al., "Thermal behavior of residual strain in silicon-on-inisulator bonded wafer and effects on electron mobility," *Solid-State Electronics*, vol. 43 (1999), pp. 1117-1120.

Ito et al., "Mechanical Stress Effect on Etch-Stop Nitride and its Impact on Deep Submicron Transistor Design," *IEEE International Electron Devices Meeting Technical Digest*, (2000), pp. 247-250.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591-593.

Ootsuka etal., "A Highly Dense, High-Performance 130nm node CMOS Technology for Large Scale System-on-a-Chip Applications," *IEEE International Electron Devices Meeting Technical Digest*, (2000), pp. 575-578.

Ota et al., "Novel Locally Strained Channel Technique for High Performance 55nm CMOS " *IEEE International Electron Devices Meeting Technical Digest*, (2002), pp. 27-30.

Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest* (2003), pp. 497-500.

Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.

Shimizu et al., "Local Mechanical-Stress Control (LMC): A New Technique for CMOS-Performance Enhancement," *IEEE International Electron Devices Meeting Technical Digest*, (2001) pp. 433436.

Thompson et al., "A Logic Nanotechnology Featuring Strained-Silicon," *IEEE Electron Device Letters*, vol. 25, No. 4 (Apr. 2004), pp. 191-193.

Thompson et al., "A 90 nm Logic Technology Featuring 50nm Strained-Silicon Channel Transistors, 7 layers of Cu Interconnects, Low κ ILD, and $Ium^2$ SRAM Cell," *IEEE International Electron Devices Meeting Technical Digest*, (2002), pp. 61-64.

Tiwari et al., "Hole Mobility Improvement in Silicon-on-Insulator and Bulk Silicon Transistors Using Local Strain," *IEEE International Electron Devices Meeting Technical Digest*, (1997), pp. 939-941.

Uchino, et al., "A Raised Source/Drain Technology Using In-situ P-doped SiGe and B-doped Si for 0.1-μm CMOS ULSIs " *IEEE International Electron Device Meeting Technical Digest*, (1997), pp. 479-482.

Abiko et al., "A Channel Engineering Combined with Channel Epitaxy Optimization and TED Suppression for 0.15 μm n-n Gate CMOS Technology", 1995 Symposium on VLSI Technology Digest of Technical Papers, Apr. 1995, pp. 23-24.

Butler and Beaty, "MOS Fabrication Process Integrating Self-Aligned Polysilicon Gate and Post-Processed Metal Gate Devices on a Single Die", IEEE, Sep. 1991, pp. 199-203.

Chang et al., "SALVO Process for Sub-50 nm Low-$V_T$ Replacement Gate CMOS with KrF Lithography", IEDM, Apr. 2000, pp. 53-56.

Chatterjee et al., "CMOS Metal Replacement Gate Transistors using Tantalum Pentoxide Gate Insulator", IEDM, Sep. 1998, pp. 777-780.

Chatterjee et al., "Sub-100nm Gate Length Metal Gate NMOS Transistors Fabricated by a Replacement Gate Process", IEDM, Jul. 1997, pp. 821-824.

Hergenrother et al., "50nm Vertical Replacement-Gate (VRG) nMOSFETs with ALD $HfO_2$ and $Al_2O_3$ Gate Dielectrics", IEDM, Mar. 2001, pp. 51-54.

Hergenrother et al., "The Vertical Replacement-Gate (VRG) MOSFET: A 50nm Vertical MOSFET with Lithography-Independent Gate Length", IEDM, Sep. 1999, pp. 75-78.

Lee et al., "Characteristics of TaN Gate MOSFET with Ultrathin Hafnium Oxide (8Å-12Å)", IEDM, Apr. 2000, pp. 39-42.

Leong et al., "A Self-Aligned Epitaxially Grown Channel MOSFET Device Architecture for Strained Si/SiGe Systems", Thin Solid Films, vol. 369, 2000, pp. 375-378.

Manchanda et al., "Si-Doped Aluminates for High Temperature Metal-Gate CMOS: Zr-Al-Si-O, A Novel Gate Dielectric for Low Power Applications", IEDM, Apr. 2000, p. 23-26.

Noda et al., "A 0.1-µm Delta-Doped MOSFET Fabricated with Post-Low-Energy Implanting Selective Epitaxy", IEEE Transactions on Electron Devices, vol. 45, No. 4, Apr. 1998, pp. 809-814.

Oh et al., "50 nm Vertical Replacement-Gate (VRG) pMOSFETs", IEDM, Apr. 2000, pp. 65-68.

Ohguro et al., "An 0.18-µm CMOS for Mixed Digital and Analog Applications with Zero-Volt-$V_{th}$ Epitaxial-Channel Mosfet's", IEEE Transactions on Electron Devices, vol. 46, No. 7, Jul. 1999, pp. 1378-1383.

Ohguro et al., "Undoped Epitaxial Si Channel n-MOSFET Grown by UHV-CVD with Preheating", IEEE Transactions on Electron Devices, vol. 45, No. 3, Mar. 1998, pp. 710-716.

Ohguro et al., "0.15-µm Buried-Channel p-MOSFET's with Ultrathin Boron-Doped Epitaxial Si Layer", IEEE Transactions on Electron Devices, vol. 45, No. 3, Mar. 1998, pp. 717-721.

Vuong et al., "Design of 25-nm SALVO PMOS Devices", IEEE Electron Devices Letters, vol. 21, No. 5, May 2000, pp. 248-250.

Wong et al., "Fabrication of Ultrathin, Highly Uniform Thin-Film SOI MOSFET's with Low Series Resistance Using Pattern-Constrained Epitaxy", IEEE Transactions on Electron Devices, vol. 44, No. 7, Jul. 1997, pp. 1131-1135.

Yeo et al, "Nanoscale Ultra-Thin-Body-Silicon-on-Insulator P-MOSFET with a SiGe/Si Heterostructure Channel", IEEE Electron Device Letters, vol. 21, No. 4, Apr. 2000, pp. 161-163.

Yeo et al., "Enhanced Performance in Sub-100 nm CMOSFETs using Strained Epitaxial Silicon-Germanium", IEDM, 2000, pp. 753-756.

Yeo et al., "Design and Fabrication of 50-nm Thin-Body p-MOSFETs with a SiGe Heterostructure Channel", IEEE Transactions on Electron Devices, vol. 49, No. 2, Feb. 2002, pp. 279-286.

Monroe, D. et al..; "Comparison of mobility-limiting mechanisms in high-mobility Si1-xGex heterostructures," J. Vac. Sci. Technol. B 11(4), Jul./Aug. 1993, pp. 1731-1737.

Currie, M.T.; "SiGe Virtual Substrate Engineering for Integration of III-V Materials, Microelectromechanical Systems, and Strained Silicon MOSFET's with Silicon," Dept. of Materials Science and Engineering in Partial Fulfillment of the Requirements for the Degree of Doctor of Philosophy in Electronic Materials at the Massachusetts Institute of Technology, Feb. 2001, pp. 158-162, 170-183.

Office Action in Japanese Patent Application No. 2003-529509, mailed Sep. 11, 2007, 5 pages (translation).

Intel'Second Amended and Objections to AmberWave's First Set of U.S.D.C. District of Delaware, C.A. No. 05-301.KAJ (consolidated) (Aug. 7, 2006) (Less redacted version).

AmberWave Systems Corporation's Responses to Intel's Third Set of Requests for Production, U.S.D.C. District of Delaware, C.A. No. 05-301-KAJ (consolidated) (Feb. 10, 2006).

AmberWave Systems Corporation's Responses to Intel's Fourth Set of Requests for Production, U.S.D.C. District of Delaware, C.A. No. 05-301-KAJ (consolidated) (May 5, 2006).

AmberWave Systems Corporation's Responses to Intel's Fifth Set of Requests for Production, U.S.D.C. District of Delaware, C.A. No. 05-301-KAJ (consolidated) (Jun. 30, 2006).

AmberWave Systems Corporation's Second Supplemental Responses to Intel's Third Set of Interrogatories, U.S.D.C., District of Delaware, C.A. No. 05-301-KAJ (consolidated) (Jul. 12, 2006).

AmberWave Systems Corporation's Responses to Intel's Fourth Set of Interrogatories, U.S.D.C. District of Delaware, C.A. No. 05-301-KAJ (consolidated) (Jul. 12, 2006).

AmberWave Systems Corporation's Responses to Intel's Fifth Set of Interrogatories, U.S.D.C. District of Delaware, C.A. No. 05-301-KAJ (consolidated) (Jun. 19, 2006).

AmberWave Systems Corporation's Responses to Intel's Sixth Set of Interrogatories, U.S.D.C. District of Delaware, C.A. No. 05-301-KAJ (consolidated) (Sep. 5, 2006).

IBM Technical Disclosure Bulletin, vol. 35, No. 4B (Sep. 1992), "2 Bit/Cell EEPROM Cell Using Band to Band Tunneling for Data Read-Out," pp. 136-140.

IBM Technical Disclosure Bulletin, vol. 32, No. 8A, Jan. 1990, "Optimal Growth Technique and Structure for Strain Relaxation of Si-Ge Layers on Si Substrates," pp. 330-331.

AmberWave Systems Corporation's Second Supplemental Responses to Intel's First Set of Interrogatories, U.S.D.C., District of Delaware, C.A. No. 05-301-KAJ (consolidated) (Jul. 12, 2006).

AmberWave Systems Corporation's Second Supplemental Response to Intel's Interrogatory No. 9, U.S.D.C., District of Delaware, C.A. No. 05-301-KAJ (consolidated) (Jul. 12, 2006).

Armstrong et al., "Design of Si/SiGe Heterojunction Complementary Metal-Oxide-Semiconductor Transistors," IEDM Technical Digest (1995 International Electron Devices Meeting) pp. 761-764.

Augusto et al., "Proposal for a New Process Flow for the Fabrication of Silicon-based Complementary MOD-MOSFETs without ion Implantation," 294 Thin Solid Films 1-2, pp. 254-258 (1997).

Barradas et al., "RBS analysis of MBE-grown SiGe/(001) Si heterostructures with thin, high Ge content SiGe channels for HMOS transistors," Modem Physics Letters B (2001) (abstract).

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999) pp. 205-210.

Bouillon et al, "Search for the optimal channel architecture for 0.18/0.12 µm bulk CMOS Experimental study," IEEE, (1996) pp. 21.2.1-21.2.4.

Bruel, "Silicon on Insulator Material Technology," 31 Electronic Letters 14, pp. 1201-1202 (1995).

Bruel et al., "SMART CUT®: A Promising New SOI Material Technology," Proceedings 1995 IEEE International SOI Conference, pp. 178-179.

Burghartz et al., "Microwave Inductors and Capacitors in Standard Multilevel Interconnect Silicon Technology," 44 IEEE Transactions on Microwave Theory and Techniques, pp. 100-104 (1996).

Canaperi et al, "Preparation of a relaxed Si-Ge layer on an insulator in fabricating high-speed semiconductor devices with strained epitaxial films," International Business Machines Corporation, USA (2002) (abstract).

Carlin et al., "High Efficiency GaAs-on-Si Solar Cells with High $V_{oc}$ Using Graded GeSi Buffers," IEEE pp. 1006-1011 (2000).

Chang et al., "Selective Etching of SiGe/Si Heterostructures," J. of the Electrochemical Soc'y, No. 1 (Jan. 1991) pp. 202-204.

Feijoo et al., "Epitaxial Si-Ge Etch Stop Layers with Ethylene Diamine Pyrocatechol for Bonded and Etchback Silicon-on-Insulator," 23 J. Electronic Materials 6, pp. 493-496 (Jun. 1994).

Fischetti, "Long-range Coulomb interactions in small Si devices. Part II. Effective electronmobility in thin-oxide structures," 89 J. App. Physics 2, pp. 1232-1250 (Jan. 2001).

Garone et al., "Silicon vapor phase epitaxial growth catalysis by the presence of germane," 56 Applied Physics Letters 13, pp. 1275-1277 (1990).

Gray and Meyer "Anal sis and Design of Analog Integrated Circuits," John Wiley & Sons, 1984, pp. 605-632.

Hackbarth et al., "Alternatives to thick MBE-grown relaxed SiGe buffers," 369 Thin Solid Films 1-2, pp. 148-151 (Jul. 2000).

Herzog et al., "SiGe-based FETs: buffer issues and device results," 380 Thin Solid Films, pp. 36-41 (2000).

Höck et al., "Carrier mobilities in modulation doped $Si_{1-x}Ge_x$ heterostructures with respect to FET applications," 336 Thin Solid Films, pp. 141-144 (1998).

Huang et al., "High-quality strain-relaxed SiGe alloy grown on implanted silicon-on-insulator substrate," 76 Applied Physics Letters 19, pp. 2680-2682 (2000).

Huang et al., "The Impact of Scaling Down to Deep Submicron on CMOS RF Circuits," 33 IEEE Journal of Solid-State Circuits 7, pp. 1023-1036 (1998).

Intel's Second Amended Responses and Objections to AmberWave's First Set of Interrogatories, U.S.D.C., District of Delaware, CA. No. 05-301-KAJ (consolidated) (Aug. 7, 2006).

International Search Report for Int'l Application No. PCT/US01/46322, Jan. 22, 2003.

Ishikawa et al., "Creation of Si-Ge-based SIMOX structures by low energy oxygen implantation," Proceedings 1997 IEEE International SOI Conference, pp. 16-17.

Ismail et al., "Modulation-doped n-type Si/SiGe with inverted interface," 65 Applied Physics Letters 10, pp. 1248-1250 (1994).

Ismail, "Si/SiGe High-Speed Field-Effect Transistors," Electron Devices Meeting, Washington, D.C. (Dec. 10, 1995) pp. 20.1.1-20.1.4.

Kim et al., "A Fully Integrated 1.9-GHz CMOS Low-Noise Amplifier," 8 IEEE Microwave and Guided Wave Letters 8, pp. 293-295 (1998).

Koester et al., "Extremely High Transconductance $Ge/Si_{0.4}Ge_{0.6}$ p-MODFETs Grown by UHV-CVD," 21 IEEE Electron Device Letters 3, pp. 110-112 (2000).

König et al., "Design Rules for n-Type SiGe Hetero FETs," 41 Solid State Electronics 10, pp. 1541-1547 (1997).

König et al., "SiGe HBTs and HFETs," 38 Solid-State Electronics 9, pp. 1595-1602 (1995).

Kuznetsov et al., "Technology for high-performance n-channel SiGe modulation-doped field-effect transistors," 13 J. Vac. Sci. Technol., B, No. 6, pp. 2892-2896 (1995).

Larson, "Integrated Circuit Technology Options for RFIC's—Present Status and Future Directions," 33 IEEE Journal of Solid-State Circuits 3, pp. 387-399 (Mar. 1998).

Lee and Wong, "CMOS RF Integrated Circuits at 5 GHz and Beyond," 88 Proceedings of the IEEE 10, pp. 1560-1571 (2000).

Lee et al., "Strained Ge channel p-type MOSFETs fabricated on $Si_{1-x}Ge_x/Si$ virtual substrates," 686 Mat. Res. Soc. Symp. Proc., pp. A1.9.1-A1.9.5 (2002).

Leitz et al., "Channel Engineering of SiGe-Based Heterostructures for High Mobility MOSFETs," 686 Mat. Res. Soc. Symp. Proc., pp. A3.10.1-A3.10.6 (2002).

Leitz et al., "Hole mobility enhancements in strained $Si/Si_{1-y}Ge_y$ p-type metal-oxidesemiconductor field-effect transistors grown on relaxed $Si_{1-x}Ge_x$ (x<y) virtual substrates," 79 Applied Physics Letters 25, pp. 4246-4248 (2001).

Li et al., "Design of high speed Si/SiGe heterojunction complementary metal-oxide-semiconductor field effect transistors with reduced short-channel effects," 20 J. Vac. Sci. Technol. A, No. 3, pp. 1030-1033 (2002).

Lu et al., "High Performance 0.1 μm Gate-Length P-Type SiGe MODFETs and MOS-MODFET's," 47 IEEE Transactions on Electron Devices 8, pp. 1645-1652 (2000).

M. Kummer et al., "Low energy plasma enhanced chemical vapor deposition," Mat. Sci. & Engineering B89, p • 288-295 (2002).

Maiti et al., "Strained-Si heterostructure field effect transistors," 13 Semicond. Sci. Technol., pp. 1225-1246 (1998).

Maszara, "Silicon-On-Insulator by Wafer Bonding: A Review," J. Electrochemical Soc'y, No. 1 (Jan. 1991) pp. 341-347.

Ota et al., "Application of heterojunction FET to power amplifier for cellular telephone," 30 Electronics Letters 11, pp. 906-907 (May 1994).

Papananos, "Radio-Frequency Microelectronic Circuits for Telecommunication Applications," pp. 115-117, 188-193 (Kluwer Academic Publishers 1999).

Parker et al., "SiGe heterostructure CMOS circuits and applications," 43 Solid State Electronics, pp. 1497-1506 (1999).

Reinking et al., "Fabrication of high-mobility Ge p-channel MOSFETs on Si substrates," 35 Electronics Letters 6, pp. 503-504 (1999).

Rim, "Application of Silicon-Based Heterostructures to Enhanced Mobility Metal-OxideSemiconductor Field-Effect Transistors," PhD Thesis, Stanford University, 1999, pp. 1-184.

Robbins et al., "A model for heterogeneous growth of $Si_{1-x}Ge_x$ films for hydrides," 69 J. App. Physics 6, pp. 3729-3732 (1991).

Sadek et al., "Design of Si/SiGe Heterojunction Complementary Metal-Oxide-Semiconductor Transistors," IEEE Trans. Electron Devices (Aug. 1996) pp. 1224-1232.

Sugimoto et al., "A 2V, 500 MHz and 3V, 920 MHz Low-Power Current-Mode 0.6 μm CMOS VCO Circuit," E82-C IEICE Trans. Electron. 7, pp. 1327-1329 (1999).

Tement et al., "Metal Gate Strained Silicon MOSFETs for Microwave Integrated Circuits," IEEE, Oct. 2000, pp. 38-43.

Usami et al., "Spectroscopic study of Si-based quantum wells with neighboring confinement structure," Semicon. Sci. Technol. 12, pp. 1596-1602 (1997).

Weiser et al., "Evidence of Real-Space Hot-Electron Transfer in High Mobility, Strained-Si Multilayer MOSFETs," 1993 IEEE IDEM Tech. Dig., pp. 545-548.

Wolf and Tauber, "Silicon Processing for the VLSI Era, vol. 1: Process. Technology," pp. 384-386 (Lattice Press, Sunset Beach, CA) (1986).

Xie, "SiGe Field effect transistors," 25 Mat. Science and Engineering, pp. 89-121 (1999).

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802, pp. 25-28 (1998).

Office Action in Japanese Patent Application No. 2003-529509, mailed Apr. 22, 2008, 4 pages (translation).

Final Office Action in Japanese Patent Application No. 2003-529509, mailed Oct. 28, 2008, 1 page (translation).

* cited by examiner

SEMICONDUCTOR STRUCTURES EMPLOYING STRAINED MATERIAL LAYERS WITH DEFINED IMPURITY GRADIENTS AND METHODS FOR FABRICATING SAME

CROSS-REFERENCE TO RELATED APPLICATION

This application is a continuation of, and incorporates herein by reference, in its entirety, U.S. patent application Ser. No. 10/251,424, filed 20 Sep. 2002, which claims priority to and the benefit of, and incorporates herein by reference, in its entirety, provisional U.S. patent application Ser. No. 60/324, 325, filed 21 Sep. 2001.

FIELD OF THE INVENTION

The present invention relates generally to semiconductor structures and devices and, more specifically, to semiconductor structures and field effect transistors (hereinafter, "FETs") incorporating strained material layers and controlled impurity diffusion gradients.

BACKGROUND OF THE INVENTION

"Virtual substrates" based on silicon (Si) and germanium (Ge) provide a platform for new generations of VLSI devices that exhibit enhanced performance when compared to devices fabricated on bulk Si substrates. The important component of a SiGe virtual substrate is a layer of SiGe that has been relaxed to its equilibrium lattice constant (i.e., one that is larger than that of Si). This relaxed SiGe layer can be directly applied to a Si substrate (e.g., by wafer bonding or direct epitaxy) or atop a relaxed graded SiGe layer, in which the lattice constant of the SiGe material has been increased gradually over the thickness of the layer. The SiGe virtual substrate can also incorporate buried insulating layers, in the manner of a silicon-on-insulator ("SOI") wafer. To fabricate high-performance devices on these platforms, thin strained layers of Si, Ge, or SiGe are grown on the relaxed SiGe virtual substrates. The resulting biaxial tensile or compressive strain alters the carrier mobilities in the layers, enabling the fabrication of high-speed devices, or low-power devices, or both.

A technique for fabricating strained Si wafers includes the following steps:

1. Providing a silicon substrate that has been edge polished;
2. Epitaxially depositing a relaxed graded SiGe buffer layer to a final Ge composition on the silicon substrate;
3. Epitaxially depositing a relaxed SiGe cap layer having a uniform composition on the graded SiGe buffer layer.
4. Planarizing the SiGe cap layer by, e.g., chemical mechanical polishing ("CMP");
5. Epitaxially depositing a relaxed SiGe regrowth layer having a uniform composition on the planarized surface of the SiGe cap layer; and
6. Epitaxially depositing a strained silicon layer on the SiGe regrowth layer.

The deposition of the relaxed graded SiGe buffer layer enables engineering of the lattice constant of the SiGe cap layer (and therefore the amount of strain in the strained silicon layer), while reducing the introduction of dislocations. The lattice constant of SiGe is larger than that of Si, and is a direct function of the amount of Ge in the SiGe alloy. Because the SiGe graded buffer layer is epitaxially deposited, it will initially be strained to match the in-plane lattice constant of the underlying silicon substrate. However, above a certain critical thickness, the SiGe graded buffer layer will relax to its inherently larger lattice constant.

The process of relaxation occurs through the formation of misfit dislocations at the interface between two lattice-mismatched layers, e.g., a Si substrate and a SiGe epitaxial layer (epilayer). Because dislocations cannot terminate inside a crystal, misfit dislocations have vertical dislocation segments at each end, i.e., threading dislocations, that may rise through the crystal to reach a top surface of the wafer. Both misfit and threading dislocations have stress fields associated with them. As explained by Eugene Fitzgerald et al., *Journal of Vacuum Science and Technology B*, Vol. 10, No. 4, 1992, incorporated herein by reference, the stress field associated with the network of misfit dislocations affects the localized epitaxial growth rate at the surface of the crystal. This variation in growth rates may result in a surface cross-hatch on lattice-mismatched, relaxed SiGe buffer layers grown on Si.

The stress field associated with misfit dislocations may also cause dislocation pile-ups under certain conditions. Dislocation pile-ups are a linear agglomeration of threading dislocations. Because pile-ups represent a high localized density of threading dislocations, they may render devices formed in that region unusable. Inhibiting the formation of dislocation pile-ups is, therefore, desirable.

Dislocation pile-ups are formed as follows. (See, e.g., Srikanth Samavedam et al., *Journal of Applied Physics*, Vol. 81, No. 7, 1997, incorporated herein by reference.) A high density of misfit dislocations in a particular region of a crystal will result in that region having a high localized stress field. This stress field may have two effects. First, the stress field may present a barrier to the motion of other threading dislocations attempting to glide past the misfits. This pinning or trapping of threading dislocations due to the high stress field of other misfit dislocations is known as work hardening. Second, the high stress field may strongly reduce the local epitaxial growth rate in that region, resulting in a deeper trough in the surface morphology in comparison to the rest of the surface cross-hatch. This deep trough may also pin threading dislocations attempting to glide past the region of high misfit dislocations. This cycle may perpetuate itself and result in a linear region with a high density of trapped threading dislocations, i.e., dislocation pile-up.

The term "MOS" (meaning "metal-oxide-semiconductor") is here used generally to refer to semiconductor devices, such as FETs, that include a conductive gate spaced at least by an insulting layer from a semiconducting channel layer. The terms "SiGe" and "$Si_{1-x}Ge_x$" are here used interchangeably to refer to silicon-germanium alloys. The term "silicide" is here used to refer to a reaction product of a metal, silicon, and optionally other components, such as germanium. The term "silicide" is also used, less formally, to refer to the reaction product of a metal with an elemental semiconductor, a compound semiconductor or an alloy semiconductor.

One challenge to the manufacturability of MOS devices with strained layers is that one or more high temperature processing steps are typically employed after the addition of the strained material. This can cause intermixing of the strained layer and underlying material. This intermixing is generally referred to as interdiffusion, and it can be described by well-known diffusion theory (e.g., Fick's laws). One example of interdiffusion is found in a FET where a strained layer is used as the channel. In this example, one or more impurities (e.g., dopants) are implanted after addition of the strained layer. If implantation is followed by a moderately high temperature step (e.g., a drive-in or anneal step), there can be rampant interdiffusion of the channel by the implant impurity due to the presence of implant damage and excess point defects in the strained layer. A result is that the impurity is present in the strained layer. Stated differently, the impurity profile (i.e., a gradient describing the impurity concentration as a function of location in the overall semiconductor or device) has a non-zero value in the strained layer. Presence of one or more impurities in the strained layer can, at certain concentrations, degrade overall device performance.

From the foregoing, it is apparent that there is still a need for a way to produce semiconductor structures and devices that include one or more strained layers that are not subject to the incursion of one or more impurity species during structure or device fabrication.

SUMMARY OF THE INVENTION

The present invention provides semiconductor structures and devices (e.g., FETs) that include one or more strained material layers that not only improve operational performance, but also are relatively free of interdiffused impurities. Consequently, the resulting semiconductor structures and devices do not exhibit the degraded performance that results from the presence of such impurities in the strained layers.

The invention features a semiconductor structure where at least one strained layer is disposed on a semiconductor substrate, forming an interface between the two. This structure is characterized by an impurity gradient that describes the concentration of one or more impurities (i.e., dopants) as a function of location in the structure. At the furthest part of the strained layer (i.e., a "distal zone" of the layer away from the interface), this impurity gradient has a value that is substantially equal to zero.

In one version of this embodiment, the invention provides a method for fabricating a semiconductor structure in a substrate. The method includes the step of disposing at least one strained layer on the substrate, forming an interface between the two. Performing at least one subsequent processing step on the substrate, after which the impurity gradient has a value substantially equal to zero in the distal zone, follows this. The subsequent processing step is generally performed within a predetermined temperature range, which affects the value of the impurity gradient, particularly in the distal zone.

In certain embodiments, the semiconductor substrate can include Si, SiGe, or any combination of these materials. It can also be multi-layered. In this latter case, the layers can include relaxed SiGe disposed on compositionally graded SiGe. The layers can also include relaxed SiGe disposed on Si. One or more buried insulating layers may be included as well.

In other embodiments, the strained layer can include Si, Ge, SiGe, or any combination of these materials. At least about fifty Angstroms of the furthest part of the strained layer defines a distal zone where the impurity gradient has a value that is substantially equal to zero.

Various features of the invention are well suited to applications utilizing MOS transistors (e.g., FETs) that include, for example, one or more of Si, $Si_{1-x}Ge_x$ or Ge layers in or on a substrate.

In another embodiment, the invention includes a FET fabricated in a semiconductor substrate. The FET has a charnel region that includes at least one strained channel layer. The strained channel layer has a distal zone away from the substrate. The impurity gradient that characterizes the substrate and the channel region has a value substantially equal to zero in the distal zone.

In one version of this embodiment, the invention provides a method for fabricating a FET in a semiconductor substrate. The method includes the step of disposing at least one strained channel layer in at least the channel region of the FET. (The strained channel layer has a distal zone away from the substrate.) Performing at least one subsequent processing step on the substrate, after which the impurity gradient has a value substantially equal to zero in the distal zone, follows this. The subsequent processing step is generally performed within a predetermined temperature range, which affects the value of the impurity gradient, particularly in the distal zone.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other objects, features, and advantages of the present invention, as well as the invention itself, will be more fully understood from the following description of various embodiments, when read together with the accompanying drawings, in which.

DETAILED DESCRIPTION

Figure 1:
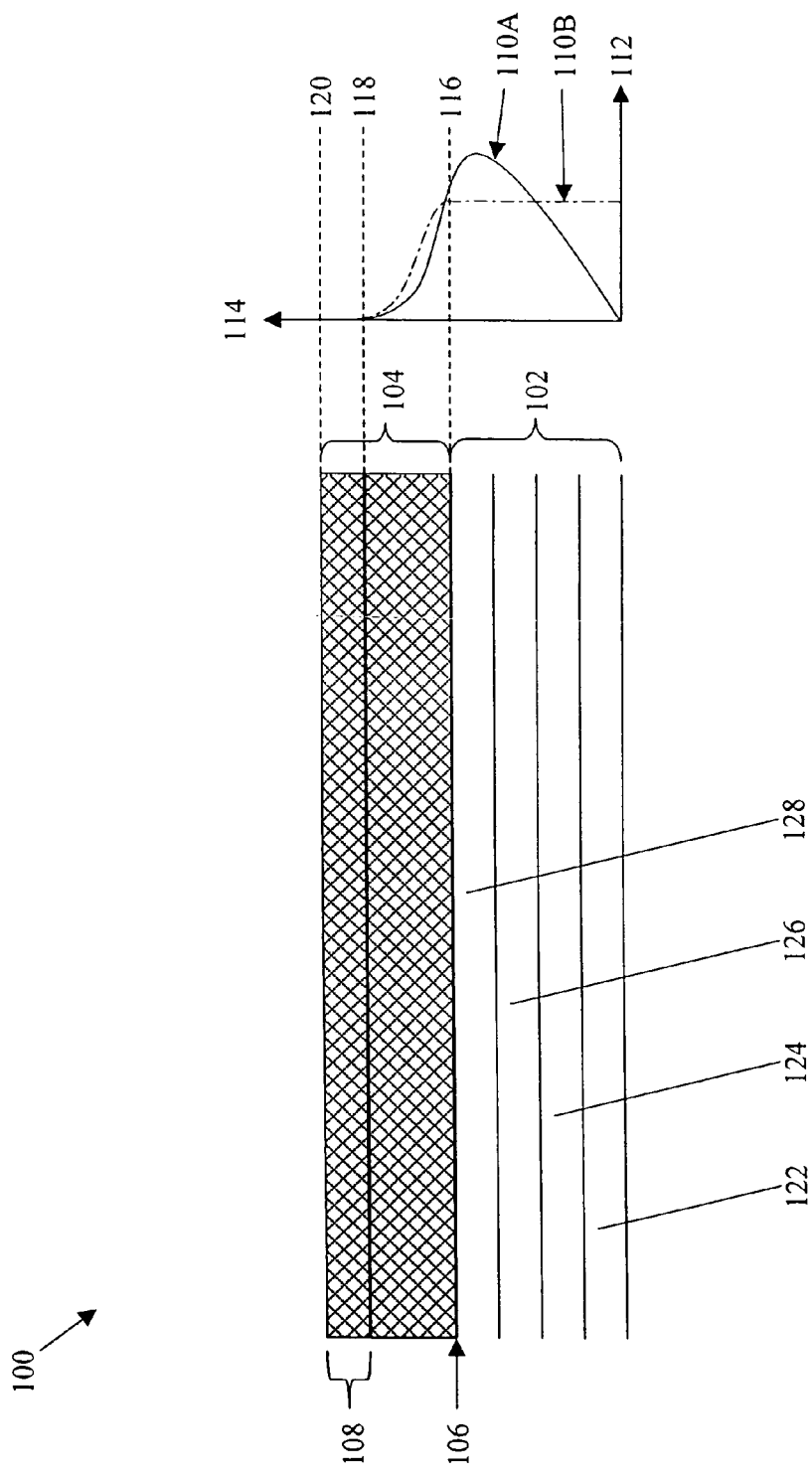
FIG. 1 is a schematic (unscaled) cross-sectional view that depicts a semiconductor structure in accordance with an embodiment of the invention.

As shown in the drawings for the purposes of illustration, the invention may be embodied in a semiconductor structure or device, such as, for example, a FET, with specific structural features. A semiconductor structure or FET according to the invention includes one or more strained material layers that are relatively free of interdiffused impurities. These strained material layers are characterized by at least one diffusion impurity gradient that has a value that is substantially equal to zero in a particular area of the strained layer. Consequently, the semiconductor structure or FET does not exhibit the degraded performance that results from the presence of such impurities in certain parts of the strained layers.

In brief overview, FIG. 1 depicts a schematic (unscaled) cross-sectional view of a semiconductor structure 100 in accordance with an embodiment of the invention. The semiconductor structure 100 includes a substrate 102. The substrate 102 may be Si, SiGe, or other compounds such as, for example, GaAs or InP. The substrate 102 may also include multiple layers 122, 124, 126, 128, typically of different materials. (Although FIG. 1 depicts four layers 122, 124, 126, 128, this is for illustration only. A single, two, or more layers are all within the scope of the invention.)

In one embodiment, the multiple layers 122, 124, 126, 128 include relaxed SiGe disposed on compositionally graded SiGe. In another embodiment, the multiple layers 122, 124, 126, 128 include relaxed SiGe disposed on Si. One or more of the multiple layers 122, 124, 126, 128 may also include a buried insulating layer, such as $SiO_2$ or $Si_3N_4$. The buried insulating layer may also be doped.

In another embodiment, a relaxed, compositionally graded SiGe layer 124 is disposed on a Si layer 122 (typically part of an Si wafer that may be edge polished), using any conventional deposition method (e.g., chemical vapor deposition ("CVD") or molecular beam epitaxy ("MBE")), and the method may be plasma-assisted. A further relaxed SiGe layer 126, but having a uniform composition, is disposed on the relaxed, compositionally graded SiGe layer 124. The relaxed, uniform SiGe layer 126 is then planarized, typically by CMP. A relaxed SiGe regrowth layer 128 is then disposed on the relaxed, uniform SiGe layer 126.

One or more strained layers 104 are disposed on the substrate 102. Between the substrate 102 and the strained layer 104 is an interface 106. Located away from the interface 106 is the distal zone 108 of the strained layer 104.

In various embodiments, the strained layer 104 includes one or more layers of Si, Ge, or SiGe. The "strain" in the strained layer 104 may be compressive or tensile, and it may be induced by lattice mismatch with respect to an adjacent layer, as described above, or mechanically. For example, strain may be induced by the deposition of overlayers, such as $Si_3N_4$. Another way is to create underlying voids by, for example, implantation of one or more gases followed by annealing. Both of these approaches induce strain in the underlying substrate 102, in turn causing strain in the strained layer 104.

The substrate 102, strained layer 104, and interface 106 are characterized, at least in part, by an impurity gradient 110A, 110B (collectively, 110). The impurity gradient 110 describes the concentration of the impurity species as a function of location across the substrate 102, strained layer 104, and interface 106. The impurity gradient 110 may be determined by solving Fick's differential equations, which describe the transport of matter:

$$J = -D\frac{\partial N}{\partial x} \quad \text{(Equation 1)}$$

$$\frac{\partial N}{\partial t} = D\frac{\partial^2 N}{\partial x^2} \quad \text{(Equation 2)}$$

In equations (1) and (2), "J" is the impurity flux, "D" is the diffusion coefficient and "N" is the impurity concentration. Equation (1) describes the rate of the permeation of the diffusing species through unit cross sectional area of the medium under conditions of steady state flow. Equation (2) specifies the rate of accumulation of the diffusing species at different points in the medium as a function of time, and applies to transient processes. In the general case, equations (1) and (2) are vector-tensor relationships that describe these phenomena in three dimensions. In some cases, equations (1) and (2) may be simplified to one dimension.

The steady state solution to equation (1), which is not detailed herein, is a function of the Gaussian error function:

$$erf(y) = \frac{2}{\sqrt{\pi}} \int_0^y e^{-z^2} dz \quad \text{(Equation 3)}$$

An example solution is shown in FIG. 1 as the impurity gradient 110. Axis 112 represents the impurity concentration, typically in units of $cm^{-3}$. Axis 114 corresponds to the location in the semiconductor structure 100. Axis 114 is aligned with the semiconductor structure 100 to illustrate a typical impurity profile, meaning that the impurity concentration at any point in the semiconductor structure 100 can be ascertained as a function of location. Except as described below, the depicted shape of the impurity gradient 110 is not intended to be limiting. For example, impurity gradient 110A may describe a profile of a p-type (e.g., boron) or n-type (e.g., phosphorous or arsenic) dopant introduced in the substrate 102. On the other hand, impurity gradient 110B may, for example, describe a substantially constant concentration of Ge, or Si, or both, in the substrate 102 that takes on a desired value (e.g., a reduced value) in the strained layer 104. Stated differently, the impurity gradient 110 may describe the concentration of any species in the substrate 102, including the substrate species itself, at any point in the semiconductor structure 100.

Boundary 116 represents the interface between the substrate 102 and the strained layer 104. Boundary 118 depicts the start of the distal zone 108 of the strained layer 104. Boundary 120 corresponds to the edge of the strained layer 104. Of note are the locations where the boundaries 116, 118, 120 intersect the axis 114 and the impurity gradient 110. In particular, the impurity gradient 110 has a value substantially equal to zero in the distal zone 108. This is depicted by the impurity gradient 110 approaching the axis 114 at boundary 118, and remaining there, or at zero, or at another value substantially equal to zero, between boundary 118 and 120. Of course, the impurity gradient 110 can also have a value substantially equal to zero before reaching the boundary 118. In any case, one embodiment of the invention features a distal zone 108 that includes at least about fifty Angstroms of the furthest part of the strained layer 104. That is, the distal zone 108 is at least about fifty Angstroms thick.

Figure 2:
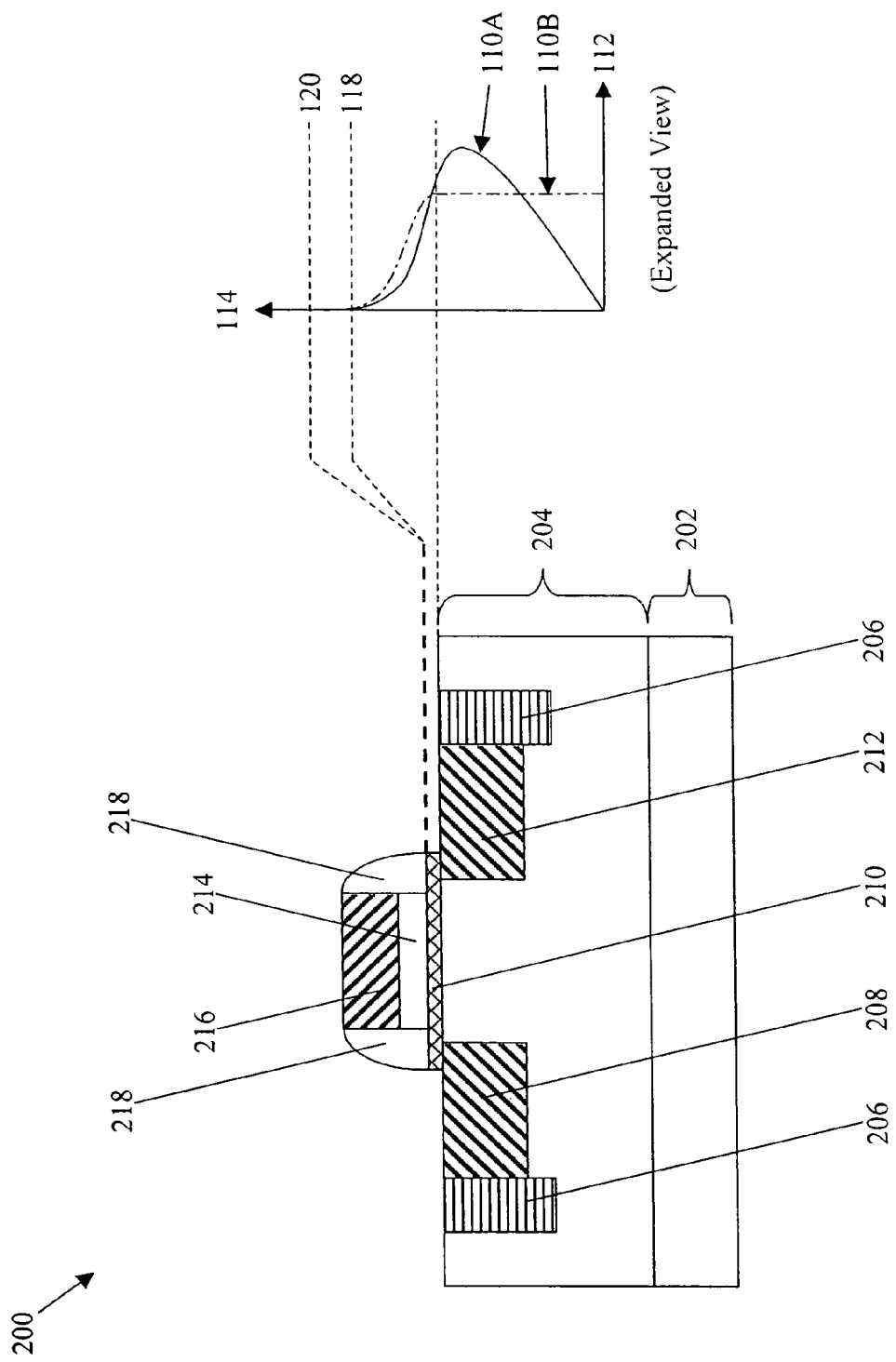
FIG. 2 is a schematic (unscaled) cross-sectional view that depicts a FET in accordance with an embodiment of the invention.

In another embodiment depicted schematically (i.e., unscaled) in FIG. 2, a FET 200 is fabricated in a similar semiconductor structure. The FET 200 includes a semiconductor substrate 202, which may be Si, SiGe, or other compounds such as, for example, GaAs or InP. The substrate 202 can be multi-layered, and it can include relaxed SiGe disposed on compositionally graded SiGe, or relaxed SiGe disposed on Si. The substrate 202 may also include a buried insulating layer, such as $SiO_2$ or $Si_3N_4$. The buried insulating layer may also be doped.

Disposed on the substrate 202 is an isolation well 204, typically including an oxide. Within the isolation well 204 are isolation trenches 206. A source region 208 and a drain region 212 are typically formed by ion implantation. A FET channel 210 is formed from one or more strained layers. The strained layers can include one or more layers of Si, Ge, or SiGe. The "strain" in the strained layers may be compressive or tensile, and it may be induced as described above. The furthest part of the channel 210 is located away from the substrate 202. This furthest part forms the distal zone of the channel 210.

Disposed on at least part of the channel 210 is a gate dielectric 214, such as, for example, $SiO_2$, $Si_3N_4$, or any other material with a dielectric constant greater than that of $SiO_2$ (e.g., $HfO_2$, HFSiON). The gate dielectric 214 is typically twelve to one hundred Angstroms thick, and it can include a stacked structure (e.g., thin $SiO_2$ capped with another material having a high dielectric constant).

Disposed on the gate dielectric 214 is the gate electrode 216. The gate electrode 216 material can include doped or undoped polysilicon, doped or undoped poly-SiGe, or metal. Disposed about the gate electrode 216 are the transistor spacers 218. The transistor spacers 218 are typically formed by depositing a dielectric material, which may be the same material as the gate dielectric 214, followed by anisotropic etching.

The impurity gradient 110 also characterizes the channel 210 and the substrate 202, as well as the isolation well 204. This is shown in FIG. 2 in an expanded view that, for clarity, differs in scale compared to the remainder of (unscaled) FIG. 2. The distal zone of the channel 210 corresponds to that portion of the impurity gradient 110 between boundaries 118, 120 (expanded for clarity). Within the distal zone of the channel 210, the impurity gradient 110 has a value substantially equal to zero. As discussed above, the depicted shape of the impurity gradient 110 is not intended to be limiting, and the impurity gradient 110 can also have a value substantially equal to zero before reaching the boundary 118. One embodiment of the invention features a distal zone 108 that includes at least about fifty Angstroms of the furthest part of the channel 210. That is, the distal zone is at least about fifty Angstroms thick.

One version of an embodiment of the invention provides a method for fabricating a FET in a semiconductor substrate. The method includes the step of disposing one or more strained channel layers in the FET channel region. The channel layer has a distal zone away from the substrate. The distal zone includes at least about fifty Angstroms of the furthest part of the channel region. An impurity gradient characterizes at least the substrate and the strained layers.

Next, one or more subsequent processing steps are performed on the substrate. After these subsequent processing steps are performed, the impurity gradient has a value that is substantially equal to zero in the distal zone. Since the impurity gradient can be influenced by temperature, the subsequent processing steps are typically performed within a predetermined temperature range that is chosen to ensure that the impurity gradient has a desired value, particularly in the distal zone.

Figure 3:
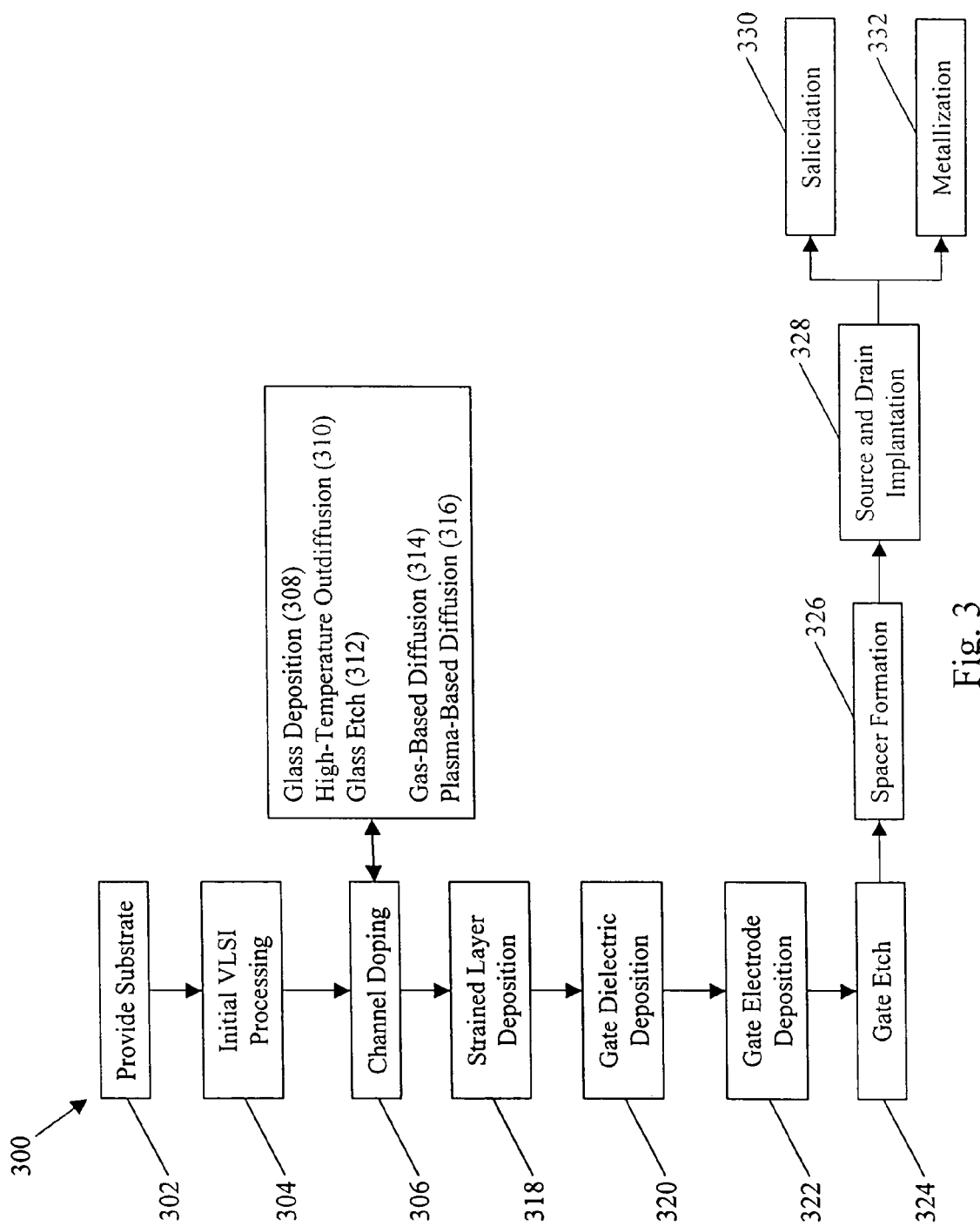
FIG. 3 is a flowchart depicting the steps of fabricating a FET in accordance with an embodiment of the invention.

FIG. 3 depicts a method 300 for fabricating the FET in accordance with an embodiment of the invention. This method includes the step of providing a substrate, typically planarized, and without strained layers (step 302). The substrate can include relaxed SiGe on a compositionally graded SiGe layer, relaxed SiGe on a Si substrate, relaxed SiGe on Si, or other compounds such as GaAs or InP. The substrate can also contain a buried insulating layer.

Next, initial VLSI processing steps are performed such as, for example, surface cleaning, sacrificial oxidation, deep well drive-in, and isolation processes like shallow trench isolation with liner oxidation or LOCOS (step 304). Any number of these steps may include high temperatures or surface material consumption. Features defined during step 304 can include deep isolation wells and trench etch-refill isolation structures. Typically, these isolation trenches will be refilled with $SiO_2$ or another insulating material, examples of which are described above.

Next, the channel region is doped by techniques such as shallow ion implantation or outdiffusion from a solid source (step 306). For example, a dopant source from glass such as BSG or PSG may be deposited (step 308), followed by a high temperature step to outdiffuse dopants from the glass (step 310). The glass can then be etched away, leaving a sharp dopant spike in the near-surface region of the wafer (step 312). This dopant spike may be used to prevent short-channel effects in deeply scaled surface channel FETs, or as a supply layer for a buried channel FET that would typically operate in depletion mode. The subsequently deposited channel layers can then be undoped, leading to less mobility-limiting scattering in the channel of the device and improving its performance. Likewise, this shallow doping may be accomplished via diffusion from a gas source (e.g., rapid vapor phase doping or gas immersion laser doping) (step 314) or from a plasma source as in plasma immersion ion implantation doping (step 316).

Next, deposit one or more strained channel layers, preferably by a CVD process (step 318). The channel may be Si, Ge, SiGe, or a combination of multiple layers of Si, Ge, or SiGe. Above the device isolation trenches or regions, the deposited channel material typically will be polycrystalline. Alternatively, the device channels may be deposited selectively, i.e., only on the device active area and not on top of the isolation regions. Typically, the remaining steps in the transistor fabrication sequence will involve lower thermal budgets and little or no surface material consumption.

Next, the transistor fabrication sequence is continued with the growth or deposition of a gate dielectric (step 320) and the deposition of a gate electrode material (step 322). Examples of gate electrode material include doped or undoped polysilicon, doped or undoped poly-SiGe, or metal. This material stack is then etched (step 324), forming the gate of the transistor. Typically, this etch removes the gate electrode material by a process such as reactive ion etching ("RIE") and stops on the gate dielectric, which is then generally removed by wet etching. After this, the deposited channel material typically is still present.

Next, the transistor spacers are formed by the traditional process of dielectric material deposition and anisotropic etching (step 326). Step 326 may be preceded by extension implantation, or removal of the channel material in the regions not below the gate, or both. If the channel material is not removed before spacer material deposition, the spacer etch may be tailored to remove the excess channel material in the regions not below the gate. Failure to remove the excess channel material above the isolation regions can result in device leakage paths.

Next, the source and drain regions are fabricated, typically by ion implantation (step 328). Further steps to complete the device fabrication can include salicidation (step 330) and metallization (step 332).

Figure 4:
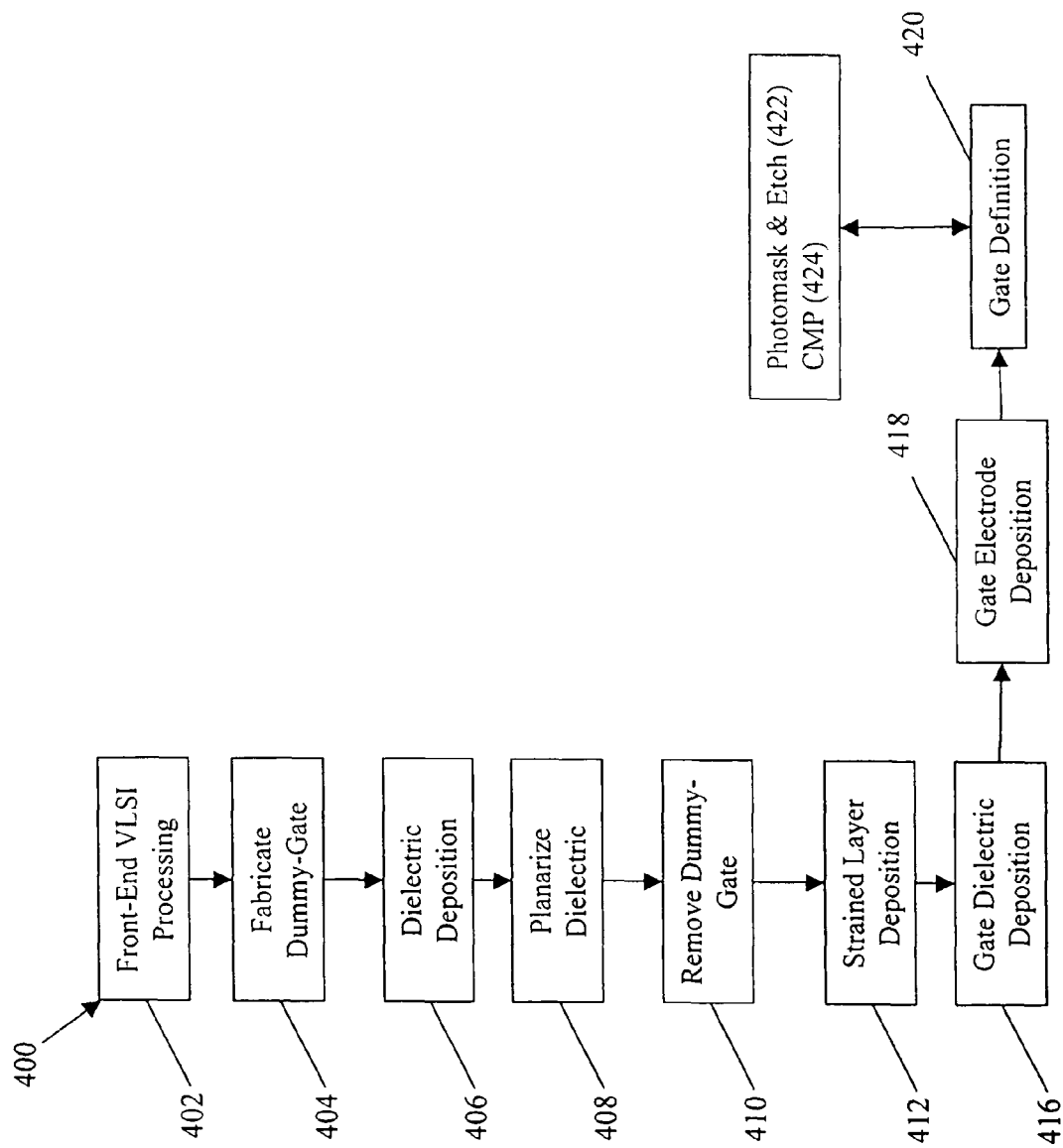
FIG. 4 is a flowchart depicting the steps of fabricating a FET in accordance with another embodiment of the invention.

FIG. 4 depicts another method 400 for fabricating the FET in accordance with an embodiment of the invention. This method includes creating the channel at a different point in the fabrication process, and starts with performing the traditional front-end VLSI processing steps, such as, for example, well formation, isolation, gate stack deposition and definition, spacer formation, source-drain implant, silicidation (step 402). In place of a gate electrode, fabricate a "dummy gate" (step 404). This dummy gate is etched and replaced in subsequent processing steps. The dummy gate may include an insulating material such as $Si_3N_4$ (or any of the other dielectric materials discussed), or a conducting material such as polysilicon, poly-Ge, or metal. In contrast to a typical MOSFET process where the gate is separated from the semiconductor substrate by a gate dielectric, the dummy gate is separated from the substrate by an etch-stop layer. The etch-stop layer can be of $SiO_2$, either thermally grown or deposited.

Next, a dielectric layer is deposited (e.g., by a CVD process) (step 406) and planarized (step 408) by, for example, CMP. This "planarization layer" is typically a different material then the dummy gate.

Next, the dummy gate is removed by a selective etching process (step 410). The etch-stop layer protects the substrate from this etching process. A wet or dry etch then removes the etch-stop layer.

An example configuration includes a polysilicon dummy gate, an $SiO_2$ etch-stop layer, $Si_3N_4$ spacers, and an $SiO_2$ planarization layer. This configuration allows selective removal of the dummy gate with an etchant such as heated tetramethylammonium hydroxide ("TMAH"), thereby leaving the $SiO_2$ and $Si_3N_4$ intact. The etch-stop is subsequently removed by a wet or dry etch (e.g., by HF).

Next, one or more strained channel layers is deposited, typically by a CVD process (step 412). The channel layers may be Si, Ge, SiGe, or a combination of multiple layers of Si, Ge, or SiGe. The gate dielectric is then thermally grown or deposited (by CVD or sputtering, for example) (step 416). This is followed by deposition of the gate electrode material (step 418), which can include doped or undoped polysilicon, doped or undoped poly-SiGe, or metal.

Next, the gate electrode is defined (step 420). This can be by photomasking and etching (step 422) of the gate electrode material. This may also be done by a CMP step (step 424), where the gate electrode material above the planarization layer is removed.

Using this method, a silicide is generally formed on the source and drain regions before the deposition of the planarization layer. In this case, all subsequent processing steps are typically limited to a temperature that the silicide can withstand without degradation. One alternative is to form the silicide at the end of the process. In this case, the planarization layer may be removed by a selective wet or dry etch which leaves the gate electrode material and the spacers intact. This is followed by a traditional silicide process, e.g., metal deposition and thermally activated silicide formation on the source and drain regions (and also on the gate electrode material, if the latter is polysilicon), followed by a wet etch strip of unreacted metal. Further steps to complete the device fabrication can include inter-layer dielectric deposition and metallization. Note that if the step of forming the gate dielectric is omitted, a metal gate electrode may be deposited directly on the channel, resulting in the fabrication of a self-aligned HEMT (or MESFET) structure.

From the foregoing, it will be appreciated that the semiconductor structures and devices provided by the invention afford a simple and effective way to minimize or eliminate the impurities in certain parts of strained material layers used therein. The problem of degraded device performance that results from the presence of such impurities is largely eliminated.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated be the appended claims, rather than by the foregoing description, and all changes which come within the meaning and range of equivalency of the claims are therefore intended to be embraced therein.

What is claimed is:

1. A semiconductor device comprising:
   at least one strained region having a distal zone;
   a gate dielectric disposed over the distal zone; and
   a gate electrode disposed over the gate dielectric;
   wherein the at least one strained region, the gate dielectric, and the gate electrode are characterized at least in part by an impurity gradient having a value substantially equal to zero in the distal zone, the impurity gradient describing a concentration of Ge.

2. The semiconductor device of claim 1 further comprising a substrate disposed below the gate dielectric.

3. The semiconductor device of claim 2 wherein the substrate comprises at least one of Si and SiGe.

4. The semiconductor device of claim 2 wherein the substrate comprises a p-type dopant.

5. The semiconductor device of claim 2 wherein the substrate comprises an n-type dopant.

6. The semiconductor device of claim 1 wherein the strained region is disposed proximate a strain-inducing material.

7. The semiconductor device of claim 6 wherein the strain-inducing material comprises SiGe.

8. The semiconductor device of claim 7 wherein the strain-inducing material comprises at least partially relaxed SiGe.

9. The semiconductor device of claim 2 wherein the substrate comprises a buried insulating layer.

10. The semiconductor device of claim 1 wherein the at least one strained region comprises at least one strained channel region.

11. The semiconductor device of claim 10 wherein the at least one strained channel region is disposed proximate a strain-inducing material.

12. The semiconductor device of claim 1 wherein the at least one strained region comprises Si.

13. The semiconductor device of claim 1 wherein the at least one strained region comprises Ge.

14. The semiconductor device of claim 1 wherein the at least one strained region comprises SiGe.

15. The semiconductor device of claim 1 wherein the distal zone has a thickness of at least about fifty Angstroms.

16. The semiconductor device of claim 1 wherein the impurity gradient has a value substantially equal to zero in the gate dielectric.

17. The semiconductor device of claim 10, further comprising: at least one source region proximate the strained channel region; and at least one drain region proximate the strained channel region.

18. The semiconductor device of claim 17 wherein the at least one source region comprises SiGe.

19. The semiconductor device of claim 17 wherein the at least one drain region comprises SiGe.

20. The semiconductor device of claim 17 further comprising at least one isolation region proximate at least one of the at least one source region and the at least one drain region.

21. The semiconductor device of claim 2 further comprising at least one isolation region proximate the strain-inducing material.

22. The semiconductor device of claim 6 wherein the at least one strained region is lattice mismatch with respect to the adjacent strain-inducing material.

23. The semiconductor device of claim 1 further comprising an overlayer disposed over the at least one strained region and comprising a strain-inducing material.

24. The semiconductor device of claim 2 further comprising a void disposed within the substrate.

25. The semiconductor device of claim 1 further comprising means for inducing strain in the at least one strained region by lattice mismatch with respect to an adjacent material.

26. The semiconductor device of claim 1 further comprising means for inducing strain in the at least one strained region.

27. The semiconductor device of claim 1 wherein the gate dielectric is characterized at least in part by a dielectric constant, the dielectric constant having a value greater than that of the dielectric constant of $SiO_2$.

28. The semiconductor device of claim 1 wherein the gate dielectric comprises at least one of $SiO_2$ and $Si_3N_4$.

29. The semiconductor device of claim 1 wherein the gate electrode comprises at least one of polysilicon, poly-SiGe, and a metal.

30. A semiconductor device comprising:
    at least one strained region having a distal zone;
    a gate dielectric disposed over the distal zone; and
    a gate electrode disposed over the gate dielectric;
    wherein the at least one strained region, the gate dielectric, and the gate electrode are characterized at least in part by an impurity gradient having a value in the distal zone sufficiently low to avoid degradation of device performance, the impurity gradient describing a concentration of Ge.

31. A semiconductor device comprising:
at least one strained region having a distal zone;
a gate dielectric disposed over the distal zone;
a gate electrode disposed over the gate dielectric; and
at least one strain-inducing material proximate the at least one strained region;
wherein the strained region and strain-inducing material are characterized at least in part by an impurity gradient describing a concentration of an impurity as a function of location in the device, the impurity concentration having a value substantially equal to zero in the distal zone, and wherein the impurity is Ge.

32. The semiconductor device of claim 31, wherein the strain-inducing region comprises at least one of SiGe and Ge.

33. The semiconductor device of claim 31, wherein the strained region comprises Si.

34. The semiconductor device of claim 12, wherein the strained region consists essentially of Si.

35. The semiconductor device of claim 1, wherein the impurity gradient has a value greater than zero in a portion of the strained region proximate the distal zone.

36. The semiconductor device of claim 1, wherein the distal zone is disposed in direct contact with the gate dielectric.

37. The semiconductor device of claim 1, wherein substantially all of the strain in the strained region is compressive.

38. The semiconductor device of claim 1, wherein substantially all of the strain in the strained region is tensile.

39. The semiconductor device of claim 33, wherein the strained region consists essentially of Si.

40. The semiconductor device of claim 31, wherein the impurity concentration has a value greater than zero in a portion of the strained region proximate the distal zone.

41. The semiconductor device of claim 31, wherein the distal zone is disposed in direct contact with the gate dielectric.

42. The semiconductor device of claim 31, wherein substantially all of the strain in the strained region is compressive.

43. The semiconductor device of claim 31, wherein substantially all of the strain in the strained region is tensile.

44. A semiconductor device comprising:
at least one strained layer having a distal zone;
a gate dielectric disposed over the distal zone; and
a gate electrode disposed over the gate dielectric;
a source region and a drain region not disposed in the at least one strained layer;
wherein the at least one strained layer, the gate dielectric, and the gate electrode are characterized at least in part by an impurity gradient having a value substantially equal to zero in the distal zone, the impurity gradient describing a concentration of Ge.

45. A semiconductor device comprising:
at least one strained region having a distal zone;
a gate dielectric disposed over the distal zone; and
a gate electrode disposed over the gate dielectric;
wherein the at least one strained region, the gate dielectric, and the gate electrode are characterized at least in part by an impurity gradient having a value substantially equal to zero in the distal zone, the impurity gradient describing a concentration of Ge and being described by an error function.

46. The semiconductor device of claim 1 further comprising a source region and a drain region not disposed in the at least one strained region.

47. The semiconductor device of claim 1 wherein the impurity gradient is described by an error function.

48. The semiconductor device of claim 30 further comprising a source region and a drain region not disposed in the at least one strained region.

49. The semiconductor device of claim 30 wherein the impurity gradient is described by an error function.

* * * * *